IMAGE

(12) United States Patent
Kang et al.

(10) Patent No.: US 11,594,548 B2
(45) Date of Patent: Feb. 28, 2023

(54) SEMICONDUCTOR DEVICE

(71) Applicant: Samsung Electronics Co., Ltd., Suwon-si (KR)

(72) Inventors: Sangmin Kang, Hwaseong-si (KR); Hanvit Yang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/029,269

(22) Filed: Sep. 23, 2020

(65) Prior Publication Data

US 2021/0313341 A1 Oct. 7, 2021

(30) Foreign Application Priority Data

Apr. 7, 2020 (KR) ........................ 10-2020-0042268

(51) Int. Cl.
| | |
|---|---|
| H01L 27/11575 | (2017.01) |
| H01L 23/48 | (2006.01) |
| H01L 23/528 | (2006.01) |
| H01L 27/11582 | (2017.01) |
| H01L 21/768 | (2006.01) |
| H01L 27/11573 | (2017.01) |
| H01L 23/50 | (2006.01) |

(52) U.S. Cl.
CPC ...... *H01L 27/11575* (2013.01); *H01L 23/481* (2013.01); *H01L 23/528* (2013.01); *H01L 27/11582* (2013.01)

(58) Field of Classification Search
CPC ................ H01L 23/481; H01L 23/528; H01L 27/11575; H01L 27/11582
See application file for complete search history.

(56) References Cited

U.S. PATENT DOCUMENTS

| | | | |
|---|---|---|---|
| 8,334,574 B2 | 12/2012 | Park et al. | |
| 8,461,028 B2 | 6/2013 | Colombo et al. | |
| 9,202,743 B2 | 12/2015 | Bao et al. | |
| 9,391,090 B2 | 7/2016 | Manorotkul et al. | |

(Continued)

OTHER PUBLICATIONS

X. Li et al. "Large-Area Synthesis of High-Quality and Uniform Grapheme Films on Copper Foils", Science 2009, 324(5932), 1312.

(Continued)

*Primary Examiner* — Herve-Louis Y Assouman
(74) *Attorney, Agent, or Firm* — Harness, Dickey & Pierce, P.L.C.

(57) ABSTRACT

A semiconductor device includes a substrate, a lower structure on the substrate, the lower structure including a first wiring structure, a second wiring structure, and a lower insulating structure covering the first and second wiring structures, a first pattern layer including a plate portion and a via portion, the plate portion being on the lower insulating structure and the via portion extending into the lower insulating structure from a lower portion of the plate portion and overlapping the first wiring structure, a graphene-like carbon material layer in contact with the via portion and the first wiring structure between the via portion and the first wiring structure, gate layers stacked in a vertical direction perpendicular to an upper surface of the substrate and spaced apart from each other on the first pattern layer, and a memory vertical structure penetrating through the gate layers in the vertical direction.

21 Claims, 22 Drawing Sheets

(56) References Cited

U.S. PATENT DOCUMENTS

| | | | |
|---|---|---|---|
| 9,431,415 B2 | 8/2016 | Shin et al. | |
| 9,991,282 B1 | 6/2018 | Shimizu et al. | |
| 2011/0233779 A1* | 9/2011 | Wada | H01L 21/76879 257/751 |
| 2012/0080661 A1* | 4/2012 | Saito | H01L 21/76879 257/29 |
| 2013/0026444 A1 | 1/2013 | Colombo et al. | |
| 2014/0029352 A1 | 1/2014 | Tanzawa | |
| 2014/0167268 A1* | 6/2014 | Bao | H01L 21/76805 257/761 |
| 2015/0129878 A1* | 5/2015 | Shin | H01L 29/66833 257/66 |
| 2017/0179154 A1* | 6/2017 | Furihata | H01L 21/76802 |
| 2019/0157284 A1 | 5/2019 | Park et al. | |
| 2019/0198524 A1 | 6/2019 | Fujiki et al. | |
| 2019/0237475 A1 | 8/2019 | Jung et al. | |
| 2021/0057335 A1* | 2/2021 | Yang | H01L 23/53266 |

OTHER PUBLICATIONS

Z. Zou et al. "Uniform single-layer graphene growth on recyclable tungsten foils", Nano Research 2015.

\* cited by examiner

SEMICONDUCTOR DEVICE

CROSS-REFERENCE TO RELATED APPLICATION

This application claims benefit of priority to Korean Patent Application No. 10-2020-0042268 filed on Apr. 7, 2020 in the Korean Intellectual Property Office, the disclosure of which is incorporated herein by reference in its entirety.

BACKGROUND

Example embodiments relate to semiconductor devices.

As demand for semiconductor devices having high performance, high speed, and/or multifunctionality has increased, the integration of semiconductor devices has increased. In order to increase the integration of semiconductor devices, a method of arranging gates in a vertical direction, instead of arranging the gates on a two-dimensional plane, has been proposed.

SUMMARY

Example embodiments of the present disclosure may provide semiconductor devices having improved reliability.

According to some example embodiments, the semiconductor device includes: a substrate; a lower structure on the substrate, the lower structure including a first wiring structure, a second wiring structure, and a lower insulating structure covering the first and second wiring structures; a first pattern layer including a plate portion and a via portion, wherein the plate portion of the first pattern layer being on the lower insulating structure and the via portion of the first pattern layer extending into the lower insulating structure from a lower portion of the plate portion and overlapping the first wiring structure; a graphene-like carbon material layer in contact with the via portion and the first wiring structure between the via portion and the first wiring structure; gate layers stacked in a vertical direction perpendicular to an upper surface of the substrate and spaced apart from each other on the first pattern layer; and a memory vertical structure penetrating the gate layers in the vertical direction.

According to some example embodiments the semiconductor device includes: a substrate; a lower structure including a first wiring structure, a second wiring structure, and a lower insulating structure covering the first and second wiring structures on the substrate; a pattern layer including a plate portion and a via portion, wherein the plate portion of the pattern layer being on the lower insulating structure and the via portion of the pattern layer extending into the lower insulating structure from a lower portion of the plate portion and overlapping the first wiring structure; a buffer conductive layer interposed between the via portion of the pattern structure and the first wiring structure and in contact with the via portion and the first wiring structure; a memory cell array region on the pattern layer; and a contact plug in contact with the second wiring structure on the second wiring structure, wherein the buffer conductive layer in contact with the first wiring structure includes a material different from the contact plug in contact with the second wiring structure.

According to some example embodiments, the semiconductor device may include: a substrate; a ground impurity region on the substrate; circuit elements including a first circuit transistor on the substrate; a ground wiring structure electrically connected to the ground impurity region on the substrate; a first circuit wiring structure electrically connected to the first circuit transistor on the substrate; a lower insulating structure covering the circuit elements, the ground wiring structure, and the first circuit wiring structure on the substrate; a pattern structure including a first pattern layer, wherein the first pattern layer includes a plate portion and a via portion, the plate portion of the first pattern layer being on the lower insulating structure, and the via portion of the first pattern layer extending into the lower insulating structure from a lower portion of the plate portion and overlapping the ground wiring structure; a buffer conductive layer interposed between the via portion of the first pattern layer and the ground wiring structure so as to be in contact with the via portion and the ground wiring structure and in contact with the via portion and the ground wiring structure; gate layers stacked in a vertical direction and spaced apart from each other on the pattern structure; a memory vertical structure penetrating the gate layers in the vertical direction; and a circuit connection wiring structure electrically connecting the pattern structure and the first circuit wiring structure.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Terms such as "first", "second" and "third" in this disclosure are used to distinguish relative positions between elements or used to distinguish one element from other components, and the technical idea of the present disclosure is not limited by these terms. Therefore, terms such as "first", "second" and "third" may be replaced with other terms and used to describe elements of the disclosure. In addition, the "first element" may be referred to as a "second element" without departing from the scope of the present disclosure.

Hereinafter, a semiconductor device and a method of forming the same according to some example embodiments will be described with reference to the accompanying drawings.

Figure 1A:
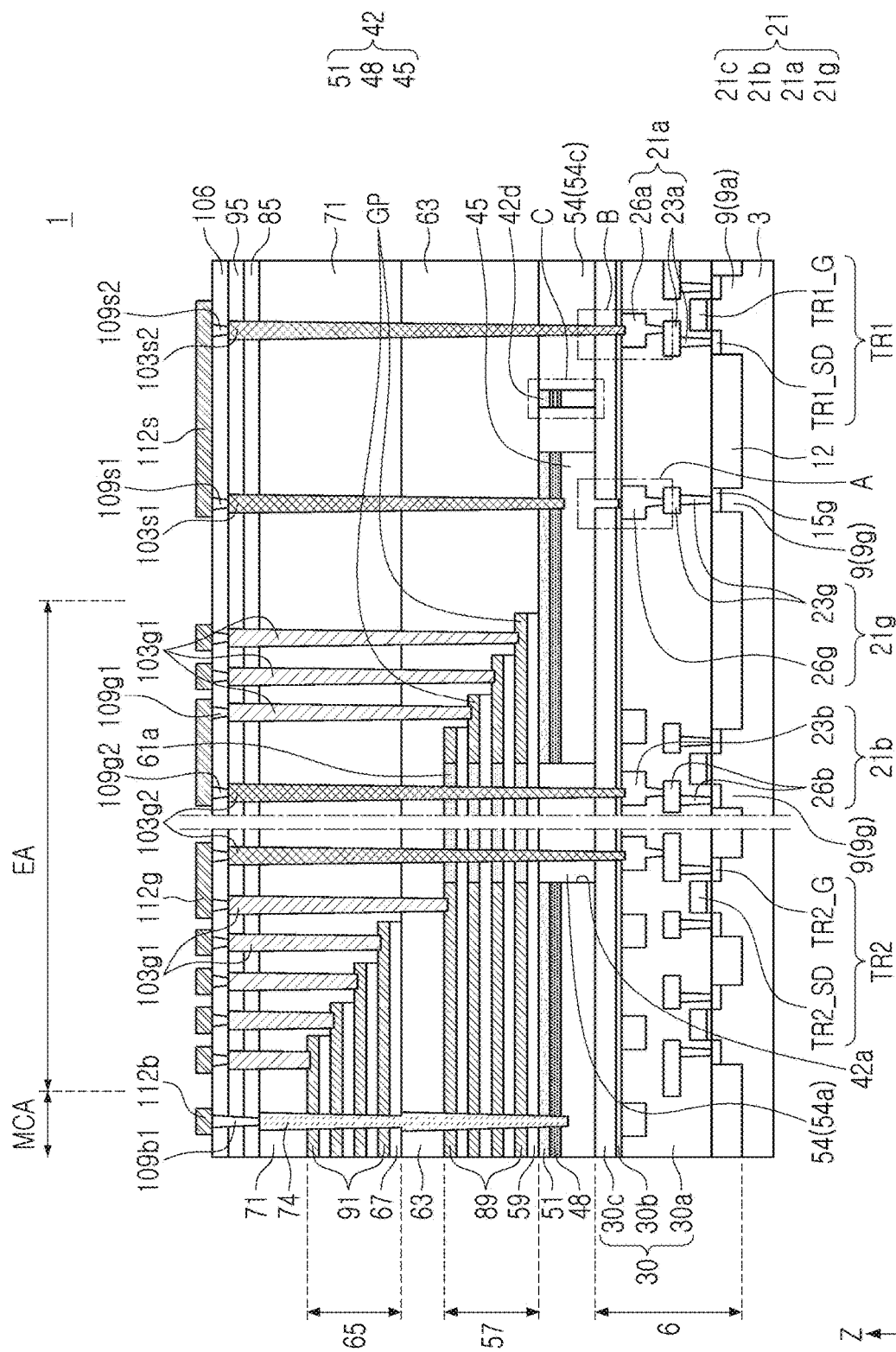
FIGS. 1A and 1B are cross-sectional views schematically illustrating an example of a semiconductor device according to some example embodiments.
Figure 1B:
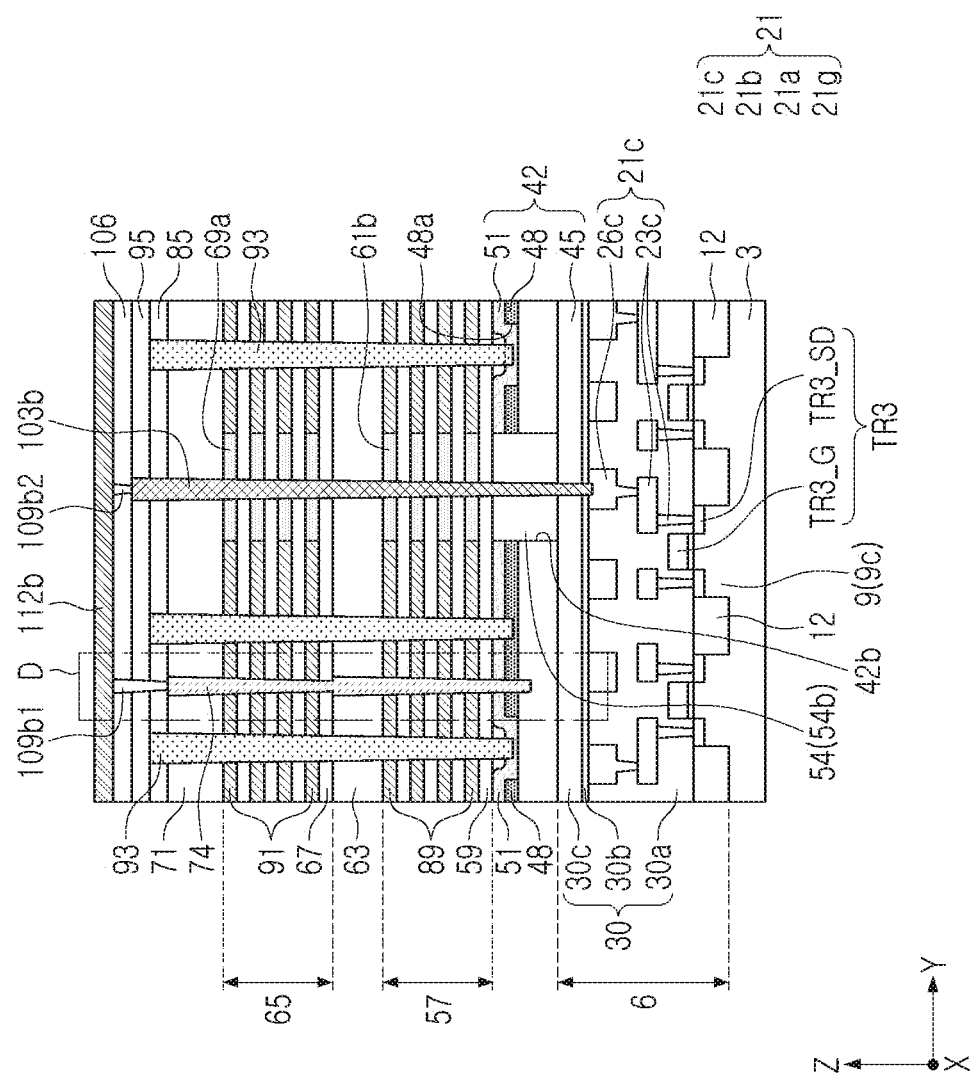
Figure 2:
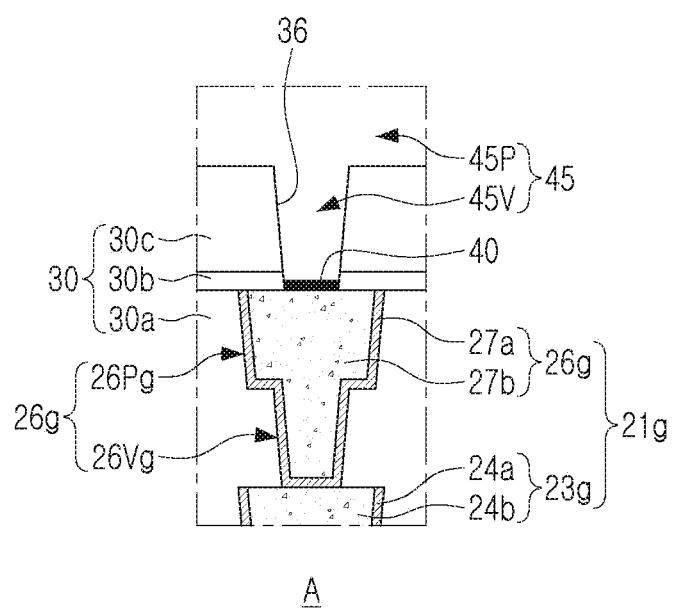
FIG. 2 is a partially enlarged view of a portion of a semiconductor device according to some example embodiments.

First, an example of a semiconductor device according to some example embodiments will be described with reference to FIGS. 1A, 1B, and 2. FIGS. 1A and 1B are cross-sectional views schematically illustrating a semiconductor device according to some example embodiments. FIG. 1A is a schematic cross-sectional view of a memory cell array region MCA and an extending region EA adjacent to the memory cell array region MCA, taken along a first direction X in a semiconductor device according to some example embodiments, and FIG. 1B is a schematic cross-sectional view of the memory cell array region MCA taken along a second direction Y perpendicular to the first direction X according to some example embodiments. FIG. 2 is a partially enlarged view of a portion indicated by "A" in FIG. 1A.

Referring to FIGS. 1A, 1B, and 2, a semiconductor device 1 according to some example embodiments may include a substrate 3 and a lower structure 6. The substrate 3 may be a semiconductor substrate. The lower structure 6 may include an isolation layer 12 defining active regions 9 on the substrate 3. The active regions 9 may protrude from the substrate 3 in a vertical direction Z. The vertical direction Z may be a direction perpendicular to an upper surface of the substrate 3. The isolation layer 12 may be a shallow trench isolation layer. The active regions 9 may include a ground active region 9g, a first circuit active region 9a, a second circuit active region 9b, and a third circuit active region 9c.

In some example embodiments, the lower structure 6 may further include a ground impurity region 12g in the ground active region 9g. In some example embodiments, the ground impurity region 15g may have an N-type conductivity type.

In some example embodiments, the lower structure 6 may further include a plurality of circuit elements TR1 to TR3. The circuit elements TR1 to TR3 may include a first circuit transistor TR1, a second circuit transistor TR2, and a third circuit transistor TR3.

The first circuit transistor TR1 may include a first circuit gate TR1_G on the first circuit active region 9a and a first circuit source/drain region TR1_SD in the first circuit active region 9a next to the first circuit gate TR1_G. The second circuit transistor TR2 may include a second circuit gate TR2_G on the second circuit active region 9b and a second circuit source/drain region TR2_SD in the second circuit active region 9b next to the second circuit gate TR2_G. The third circuit transistor TR3 may include a third circuit gate TR3_G on the third circuit active region 9c and a third circuit source/drain region TR3_SD in the third circuit active region 9c next to the third circuit gate TR3_G.

In some example embodiments, the lower structure 6 may further include a device wiring (or line) structure 21 and a lower insulating structure 30 covering the device wiring structure 21.

The device wiring structure 21 may include a ground wiring structure 21g and first to third circuit wiring structures 21a to 21c. The ground wiring structure 21g may include a ground lower wiring structure 23g electrically connected to the ground impurity region 15g and a ground upper wiring structure 26g electrically connected to the ground lower wiring structure 23g on the ground lower wiring structure 23g.

In some example embodiments, the ground lower wiring structure 23g may include a ground lower gap fill layer (24b in FIG. 2) and a ground lower barrier layer (24a in FIG. 2) covering side and bottom surfaces of the ground lower gap fill layer 24b.

In some example embodiments, the ground upper wiring structure 26g may include a ground pad portion (26Pg in FIG. 2) and a ground via portion (26Vg in FIG. 2) extending from the lower portion of the ground pad portion (26Pg in FIG. 2) and disposed to be in contact with the ground lower wiring structure 23g.

In some example embodiments, the ground upper wiring structure 26g may include a ground upper gap fill layer (27b in FIG. 2) and a ground upper barrier layer (27a in FIG. 2) covering side and bottom surfaces of the ground upper gap fill layer 27b.

The ground upper gap fill layer (27b in FIG. 2) may be integrally formed within the ground pad portion (26Pg in FIG. 2) and the ground via portion (26Vg in FIG. 2), and the ground upper barrier layer (27a in FIG. 2) may conformally cover side and bottom surfaces of the ground upper gap fill layer 27b.

In some example embodiments, the lower wiring barrier layer (24a in FIG. 2) and the ground upper barrier layer (27a in FIG. 2) may include metal nitride. For example, each of the lower wiring barrier layer (24a in FIG. 2) and the ground upper barrier layer (27a in FIG. 2) may include a titanium nitride (TiN), a titanium silicon nitride (TiSiN), a tungsten nitride (WN), a tantalum nitride (TaN), or a combination thereof.

In some example embodiments, each of the lower wiring gap fill layer (24b in FIG. 2) and the upper wiring gap fill layer (27b in FIG. 2) may be formed of a metallic material. For example, each of the lower wiring gap fill layer (24b in FIG. 2) and the upper wiring gap fill layer (27b in FIG. 2) may include tungsten (W), molybdenum (Mo), titanium (Ti), rubidium (Rb) or a combination thereof.

The first circuit wiring structure 21a may include a first circuit lower wiring structure 23a electrically connected to the first transistor TR1 and a first circuit upper wiring structure 26a electrically connected to the first lower wiring structure 23a on the first circuit lower wiring structure 23a. The second circuit wiring structure 21b may include a second circuit lower wiring structure 23b electrically connected to the second transistor TR2 and a second circuit upper wiring structure 26b electrically connected to the second circuit lower wiring structure 26b on the second circuit lower wiring structure 23b. The second circuit wiring structures 21b may be provided in plurality. The third circuit wiring structure 21c may include a third circuit lower wiring structure 23c electrically connected to the third transistor TR3 and a third circuit upper wiring structure 26c electrically connected to the third circuit lower wiring structure 23c on the third circuit lower wiring structure 23c. The third circuit wiring structure 21c may be provided in plurality.

The lower insulating structure 30 may include a first lower insulating layer 30a covering the device wiring structure 21 and exposing an upper surface of the uppermost layer of the device wiring structure 21, an etch stop layer 30b on the first lower insulating layer 30a, and a second lower insulating layer 30c on the etch stop layer 30b.

The etch stop layer 30b may be formed of a material having etch selectivity with the first and second lower insulating layers 30a and 30c adjacent to the etch stop layer 30b. For example, the etch stop layer 30b may be formed of a silicon nitride, a silicon oxynitride, or a high-k dielectric (e.g., AlO), and the first and second lower insulating layers 30a and 30c adjacent to the etch stop layer 30b may be formed of a silicon oxide.

The semiconductor device 1 according to some example embodiments may further include a pattern structure 42.

The pattern structure 42 may include a first inner opening 42a and a second inner opening 42b.

In some example embodiments, the pattern structure 42 may include a first pattern layer 45, a second pattern layer 48 having an opening 48a on the first pattern layer 45, and a third pattern layer 51 provided on the lower pattern layer 45 and covering the second pattern layer 48.

In some example embodiments, the first pattern layer 45 may include first polysilicon, the second pattern layer 48 may include second polysilicon, and the third pattern layer 51 may include third polysilicon. For example, the first pattern layer 45, the second pattern layer 48, and the third pattern layer 51 may include polysilicon having an N-type conductivity type.

In some example embodiments, the pattern structure 42 may include a first portion in which the first pattern layer 45 and the third pattern layer 51 are in direct contact with each other and a second portion in which the second pattern layer 48 is interposed between the first pattern layer 45 and the third pattern layer 51. In the pattern structure 42, the first portion in which the first pattern layer 45 and the third pattern layer 51 are in direct contact with each other may be provided in plurality and spaced apart from each other.

In some example embodiments, the first pattern layer 45 may include a plate portion (45P in FIG. 2) formed on the second lower insulating layer 30c and a via portion (45V in FIG. 2) extending downward from the plate portion (45P in FIG. 2) and overlapping the ground upper wiring structure 26g. The via portion (45V in FIG. 2) may be disposed in the via hole 36 of the lower insulating structure 30 exposing a portion of the ground pad portion (26Pg in FIG. 2). A side surface of the via portion (45V in FIG. 2) may be in contact with the lower insulating structure 30.

In some example embodiments, in the first pattern layer 45, the plate portion (45P in FIG. 2) and the via portion (45V in FIG. 2) may be integrally formed. For example, in the first pattern layer 45, the plate portion (45P in FIG. 2) and the via portion (45V in FIG. 2) may be formed of one continuously extending polysilicon.

The semiconductor device 1 according to some example embodiments may further include a buffer conductive layer 40 interposed between the via portion (45V in FIG. 2) of the first pattern layer 45 and the ground pad portion (26Pg in FIG. 2) of the ground upper wiring structure 26g. The buffer conductive layer 40 may be a graphene-like carbon material layer. Hereinafter, the buffer conductive layer 40 will be referred to as a graphene-like carbon material layer.

The etch stop layer 30b may cover at least a portion of a side surface of the buffer conductive layer, i.e., the graphene-like carbon material layer 40, while covering a portion of an upper surface of the ground wiring structure 21g.

The graphene-like carbon material layer 40 may be in contact with an upper surface of the ground upper gap fill layer 27b and a lower surface of the via portion (45V in FIG. 2). The graphene-like carbon material layer 40 may be spaced apart from the ground upper barrier layer 27a. A separation distance between the graphene-like carbon material layer 40 and the ground upper barrier layer 27a may be greater than a thickness of the ground upper barrier layer 27a. A separation distance between the graphene-like carbon material layer 40 and the ground upper barrier layer 27a may be greater than twice the thickness of the ground upper barrier layer 27a.

The graphene-like carbon material layer 40 may be single layer graphene, multi-layer graphene, graphitic carbon, or graphite.

The semiconductor device 1 according to some example embodiments may further include a dummy pattern 42d. The dummy pattern 42d may have substantially the same thickness as the pattern structure 42. The dummy pattern 42d may have an upper surface coplanar with an upper surface of the pattern structure 42.

The semiconductor device 1 according to some example embodiments may further include an intermediate insulating structure 54. The intermediate insulating structure 54 may include a first intermediate insulating layer 54a in the first inner opening 42a of the pattern structure 42, a second intermediate insulating layer 54b in the second inner opening 42b of the pattern structure 42, and a third intermediate insulating layer 54c surrounding an outer surface of the pattern structure 42 and surrounding a side surface of the dummy pattern 42d.

The semiconductor device 1 according to some example embodiments may further include a lower stacked structure 57 on the pattern structure 42, a lower capping insulating layer 63 on the lower stacked structure 57, an upper stacked structure 65 on the lower capping insulating layer 63, and an upper capping insulating layer 71 on the upper stacked structure 65.

The lower stacked structure 57 may include lower interlayer insulating layers 59 and lower gate layers 89 alternately repeatedly stacked.

The lower stacked structure 57 may further include first lower mold layers 61a overlapping the first inner intermediate insulating layer 54a and second lower mold layers 61b overlapping the second inner intermediate insulating layer 54b. The first and second lower mold layers 54a and 54 may be located at the same height level as the lower gate layers 89. The upper stacked structure 65 may include upper interlayer insulating layers 67 and upper gate layers 91 being alternately repeatedly stacked. The upper stacked structure 65 may further include upper mold layers 69a overlapping the second inner intermediate insulating layer 54b.

In some example embodiments, the lower and upper gate layers 59 and 91 may be sequentially arranged in the vertical direction Z perpendicular to an upper surface of the substrate 3 in the memory cell array region MCA and may have gate pads GP arranged in a step shape in an extending area EA adjacent to the memory cell array region MCA.

The semiconductor device 1 according to some example embodiments may further include a memory vertical structure 74 extending into the pattern structure 42 sequentially through the upper capping insulating layer 71, a pre-upper stacked structure 64, the lower capping insulating layer 63, and a pre-lower stacked structure 56.

The semiconductor device 1 according to some example embodiments may further include a first upper insulating layer 85, a second upper insulating layer 95, and a third upper insulating layer 106 sequentially stacked on the upper capping insulating layer 71.

The semiconductor device 1 according to some example embodiments may further include separation structures 93 extending into the pattern structure 42 sequentially through the first upper insulating layer 85, the upper capping insulating layer 71, the upper stacked structure 65, the lower capping insulating layer 63, and the lower stacked structure 57.

The separation structures 93 may penetrate the upper gate layers 91 of the upper stacked structure 65 and the lower gate layers 59 of the lower stacked structure 57. The separation structures 93 may be spaced apart from the first and second lower mold layers 61a and 61b and the upper mold layers 69a.

In some example embodiments, the separation structures 93 may include an insulating material (e.g., silicon oxide, etc.).

The semiconductor device 1 according to some example embodiments may further include contact plugs 103g1, 103g2, 103s1, 103s2, and 103b and connection plugs 109g1, 109g2, 109s1, 109s2, 109b1, and 109b2.

The contact plugs 103g1, 103g2, 103s1, 103s2, and 103b may include first gate contact plugs 103g1, second gate contact plugs 103g2, a first source contact plug 103s1, a second source contact plug 103s2, and a bit line contact plug 103b.

The first gate contact plugs 103g1 may be electrically connected to the gate pads GP on the gate pads GP. The second gate contact plugs 103g2 may be electrically connected to the second circuit upper wiring structures 26b on the second circuit upper wiring structures 26b. The first source contact plug 103s1 may be electrically connected to the pattern structure 42 on the pattern structure 42. The second source contact plug 103s2 may be electrically connected to the first circuit upper wiring structure 26a on the first circuit upper wiring structure 26a. The bit line contact plug 103b may be electrically connected to the third circuit upper wiring structure 26c on the third circuit upper wiring structure 26c.

The first gate contact plugs 103g1 may extend downward through the first and second upper insulating layers 85 and 95 so as to be in contact with the gate pads GP of the lower and upper gate layers 89 and 91.

The second gate contact plugs 103g2 may extend downward through the first and second upper insulating layers 85 and 95 so as to be in contact with the second circuit upper wiring structures 26b, respectively. The second gate contact plugs 103g2 may penetrate the etch stop layer 30b, the second lower insulating layer 30c, the first intermediate insulating layer 54a, and the first lower mold layers 61a of the lower stacked structure 57.

The first source contact plug 103s1 may penetrate the first and second upper insulating layers 85 and 95 and the lower and upper capping insulating layers 63 and 71 so as to be in contact with the pattern structure 42. The first source contact plug 103s1 may be directly or indirectly electrically connected to the first pattern layer 45.

In some example embodiments, the first source contact plug 103s1 may sequentially penetrate the third pattern layer 51 and the second pattern layer 48 so as to be in contact with the first pattern layer 45 and may be electrically connected to the pattern structure 42.

In some example embodiments, the first source contact plug 103s1 may penetrate the third pattern layer 51 so as to be in contact with the second pattern layer 48, may be spaced apart from the first pattern layer 45, and may be electrically connected to the pattern structure 42.

In some example embodiments, the first source contact plug 103s1 may be in contact with the third pattern layer 51, may be spaced apart from the first and second pattern layers 45 and 48, and may be electrically connected to the pattern structure.

The second source contact plug 103s2 may penetrate the first and second upper insulating layers 85 and 95, the lower and upper capping insulating layers 63 and 71, the third intermediate insulating layer 54c, the second lower insulating layer 30c, and the etch stop layer 30b, so as to be in contact with the first circuit upper wiring structure 26a.

The bit line contact plug 103b may extend downward through the first and second upper insulating layers 85 and 95 and penetrate through the upper mold layers 69a, the second lower mold layers 61b, the second intermediate insulating layer 54b, the second lower insulating layer 30c, and the etch stop layer 30b so as to be in contact with the third circuit upper wiring structure 26c.

The connection plugs 109g1, 109g2, 109s1, 109s2, 109b1, and 109b2 may include a first gate connection plug 109g1 electrically connected to the first gate contact plug 103g1 on the first gate contact plug 103g1, a second gate connection plug 109g2 electrically connected to the second gate contact plug 103g2 on the second gate contact plug 103g2, a first source connection plug 109s1 electrically connected to the first source contact plug 103s1 on the first source contact plug 103s1, a second source connection plug 109s2 electrically connected to the second source contact plug 103s2 on the second source contact plug 103s2, a first bit line connection plug 109b1 electrically connected to the memory vertical structure 74 on the memory vertical structure 74, and a second bit line connection plug 109b2 electrically connected to the bit line contact plug 103b on the bit line contact plug 103b.

The semiconductor device 1 according to some example embodiments may include a bit line 112b electrically connected to the first and second bit line connection plugs 109b1 and 109b2 on the third upper insulating layer 106, a source connection wiring 112s electrically connected to the first and second source connection plugs 109s1 and 109s2 on the third upper insulating layer 106, and a gate connection wire 112g electrically connected to the first and second gate connection plugs 109g1 and 109g2 on the third upper insulating layer 106.

In example embodiments, the pattern structure 42 may be a common source line formed of polysilicon having an N-type conductivity type. The pattern structure 42 may be grounded to the ground impurity region 15g on the substrate 3 through the ground wiring structure 21g. The pattern structure 42 may be electrically connected to the first circuit transistor TR1 through the first and second source contact plugs 103s1 and 103s2 and the source connection wiring 112s.

A circuit connection wiring structure electrically connecting the pattern structure 42 and the first circuit wiring structure 21a may be provided. The circuit connection wiring structure may include the first source contact plug 103s1 on the pattern structure 42, the second source contact plug 103s2 on the first circuit wiring structure 21a, and a source connection wiring 112s electrically connecting the first and second source contact plugs 103s1 and 103s2 on the first and second source contact plugs 103s1 and 103s2.

According to some example embodiments, the pattern structure 42, which may be a common source line, may be electrically connected to the first circuit transistor TR1, while being grounded to the ground impurity region 15g on the substrate 3.

In example embodiments, the graphene-like carbon material layer 40 may have a thickness smaller than a thickness of the etch stop layer 30b. However, the example embodiments are not limited thereto. Hereinafter, modifications of the graphene-like carbon material layer 40 will be described with reference to FIGS. 3A, 3B, 3C, and 3D, respectively. FIGS. 3A, 3B, 3C, and 3D are partially enlarged views corresponding to FIG. 2.

Figure 3A:
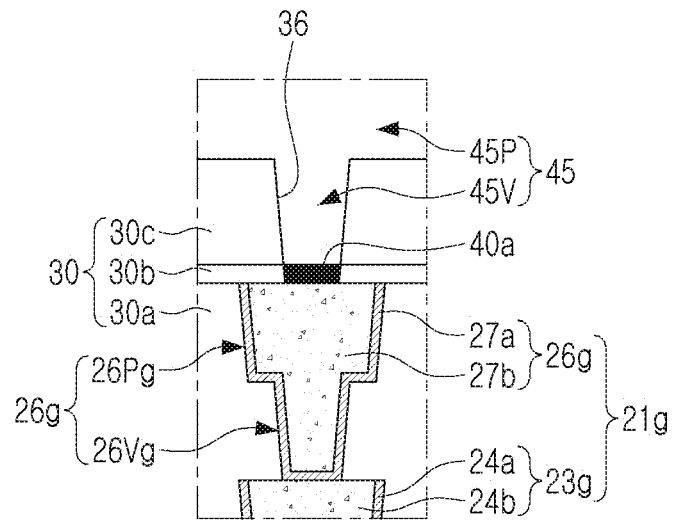
FIGS. 3A, 3B, 3C, and 3D are partially enlarged views schematically illustrating a modification of a part of a semiconductor device according to some example embodiments.

In a modification, referring to FIG. 3A, the graphene-like carbon material layer of FIG. 2 (40 of FIG. 2) may be replaced with a graphene-like carbon material layer 40a having a thickness substantially equal to that of the etch stop layer 30b as illustrated in FIG. 3A.

Figure 3B:
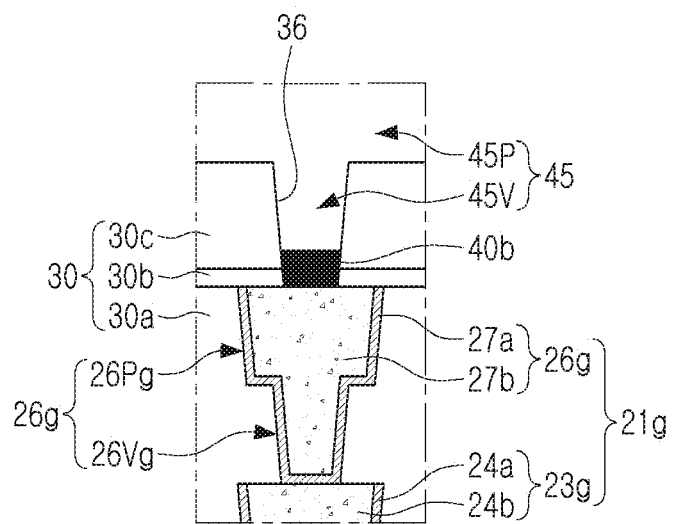

In a modification, referring to FIG. 3B, the graphene-like carbon material layer of FIG. 2 (40 of FIG. 2) may be replaced with a graphene-like carbon material layer 40a having a thickness larger than that of the etch stop layer 30b as illustrated in FIG. 3B. In some example embodiments, the graphene-like carbon material layer 40b may have a thickness of about twice or larger the thickness of the etch stop layer 30b.

Figure 3C:
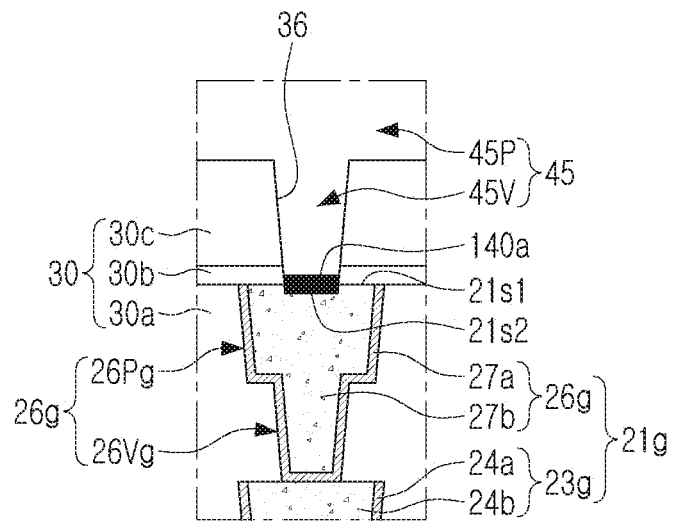

In a modification, referring to FIG. 3C, the graphene-like carbon material layer of FIG. 2 (40 of FIG. 2) may be replaced by a graphene-like carbon material layer 140a extending into the ground pad portion 26Pg as illustrated in FIG. 3Ct. For example, the graphene-like carbon material layer 140a may include a portion extending from an upper surface of the ground pad portion 26Pg into the ground pad portion 26Pg. An upper end 21s1 of the ground pad portion 26Pg may be located at a height level higher than a lower end 21s2 of the graphene-like carbon material layer 140a. The upper surface of the graphene-like carbon material layer 140a may be located at a height level higher than the upper end 21s1 of the ground pad portion 26Pg. An interface between the etch stop layer 30b and the ground pad portion 26Pg may be in contact with a side surface of the graphene-like carbon material layer 140a. The upper surface of the graphene-like carbon material layer 140a may be located at a height level lower than the upper surface of the etch stop layer 30b.

Figure 3D:
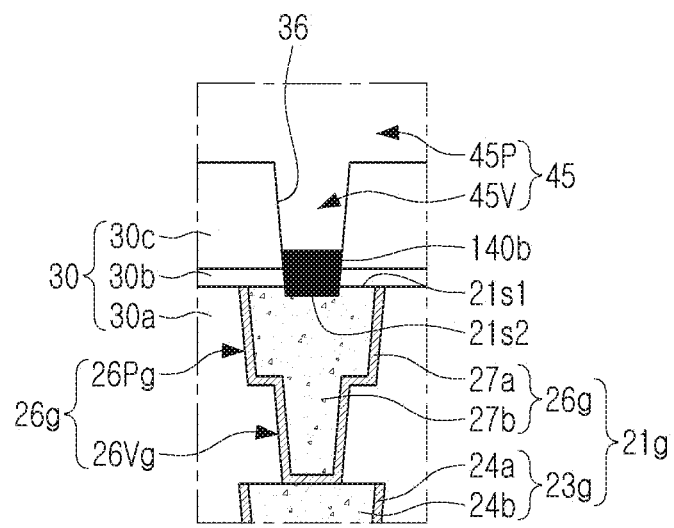

In a modification, referring to FIG. 3D, the graphene-like carbon material layer of FIG. 2 (40 of FIG. 2) may be replaced with the graphene-like carbon material layer 140b extending into the ground pad portion 26Pg as illustrated in FIG. 3D. An interface between the etch stop layer 30b and the ground pad portion 26Pg may be in contact with a side surface of the graphene-like carbon material layer 140a, and an upper surface of the graphene-like carbon material layer 140b may be located at a height level higher than the upper surface of the graphene-like carbon material layer 140a. In some example embodiments, the upper surface of the graphene-like carbon material layer 140b may be located at a substantially same height level as the upper surface of the graphene-like carbon material layer 140a.

Figure 4A:
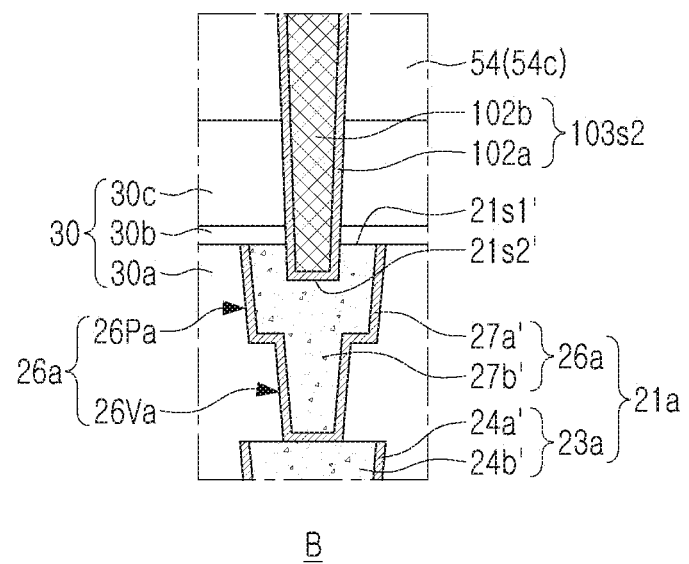
FIGS. 4A and 4B are partially enlarged views of a portion of a semiconductor device according to some example embodiments.

Next, an example of the second source contact plug 103s2 and the first circuit wiring structure 21a will be described with reference to FIG. 4A. FIG. 4A is a partially enlarged view of a portion indicated by "B" in FIG. 1A.

Referring to FIGS. 1A, 1B, and 4A, the second source contact plug 103s2 may include a contact gap fill layer 102b and a contact barrier layer 102a covering lower and side surfaces of the contact gap fill layer 102b. The contact gap fill layer 102b may be formed of a metal material, and the contact barrier layer 102a may be formed of a metal nitride. For example, the contact gap fill layer 102b may include tungsten (W), molybdenum (Mo), titanium (Ti), rubidium (Rb), or a combination material thereof, and the contact barrier layer 102a may include a titanium nitride (TiN), a titanium silicon nitride (TiSiN), a tungsten nitride (WN), a tantalum nitride (TaN), or a combination thereof.

The first circuit lower wiring structure 23a of the first circuit wiring structure 21a may include a circuit lower gap fill layer 24b' and a circuit lower barrier layer 24a' covering side and bottom surfaces of the circuit lower gap fill layer 24b'. The first circuit upper wiring structure 26a of the first circuit wiring structure 21a may include a circuit upper gap fill layer 27b' and a circuit upper barrier layer 27a' covering side and bottom surfaces of the circuit upper gap fill layer 27b'. The first circuit wiring structure 21a may be formed of the same material as the ground wiring structure 21g. For example, the circuit upper gap fill layer 27b' may be formed of the same material as the ground upper gap fill layer 27b, and the circuit upper barrier layer 27a' may be formed of the same material as the ground upper barrier layer 27a.

The first circuit upper wiring structure 26a may include a circuit pad portion 26Pa and a circuit via portion 26Va extending from a lower portion of the circuit pad portion 26Pa. The circuit upper gap fill layer 27b' may be integrally formed in the circuit pad portion 26Pa and the circuit via portion 26Va, and the circuit upper barrier layer 27a' may conformally cover the side and bottom surfaces of the circuit upper gap fill layer 27b'.

An upper surface 21s1' of the circuit pad portion 26Pa and an upper surface of the ground pad portion 26Pg may be coplanar. The upper surface 21s1' of the circuit pad portion 26Pa and the upper surface of the ground pad portion 26Pg may be located at the same height level.

The lower surface 21s2' of the second source contact plug 103s2 may be located at a height level lower than the lower surface of the graphene-like carbon material layer 40.

In example embodiments, the term "height level" may be a height level based on an upper surface of the substrate (3 in FIG. 1A).

In some example embodiments, a distance between the lower surface 21s2' of the second source contact plug 103s2 and the upper surface 21s1' of the circuit pad portion 26Pa may be larger than a distance between the lower surface 21s2 of the graphene-like carbon material layer (140a in FIG. 3C) described above with reference to FIG. 3C and the upper surface 21s1 of the ground pad portion 26Pg.

In some example embodiments, the distance between the lower surface 21s2' of the second source contact plug 103s2 and the upper surface 21s1' of the circuit pad portion 26Pa may be larger than the distance between the lower surface 21s2 of the graphene-like carbon material layer (140b in FIG. 3D) and the upper surface 21s1 of the ground pad portion 26Pg.

In some example embodiments, each of the first gate contact plugs 103g1, the second gate contact plugs 103g2, the first source contact plug 103s1, and the bit line contact plug 103b may include the contact gap fill layer 102b and the contact barrier layer 102a, which are the same as the second source contact plug 103s2.

In some example embodiments, each of the first gate contact plugs 103g1, the second gate contact plugs 103g2, the first source contact plug 103s1, and the bit line contact plug 103b may have the same cross-sectional structure as that of the second source contact plug 103s2.

In some example embodiments, the second and third circuit upper wiring structures 26b and 26c may have the same cross-sectional structure as the first circuit upper wiring structure 26a. Accordingly, each of the second and third circuit upper wiring structures 26b and 26c may include the circuit pad portion 26Pa and the circuit via portion 26Va. Each of the second and third circuit upper wiring structures 26b and 26c may include the circuit upper gap fill layer 27b' and the circuit upper barrier layer 27a'.

Next, an example of the dummy pattern (42d in FIG. 1A) will be described with reference to FIG. 4B. FIG. 4A is a partially enlarged view of a portion indicated by "C" in FIG. 1A.

Figure 4B:
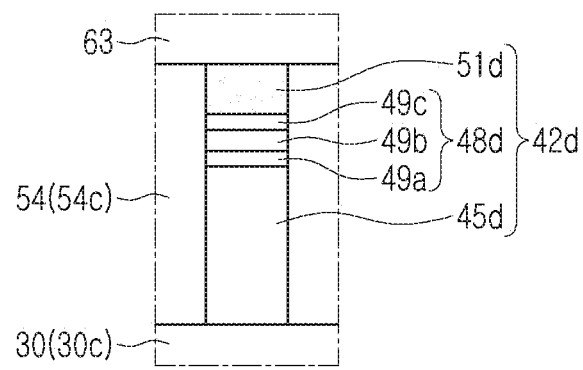

Referring to FIGS. 1A and 4B, the dummy patterns 42d may include a lower dummy pattern layer 45d, an intermediate dummy pattern layer 48d, and an upper dummy pattern layer 51d which are sequentially stacked and have vertically aligned side surfaces.

The lower dummy pattern layer 45d may be formed of the same material and/or and have the same thickness as the first pattern layer 45. The intermediate dummy pattern layer 48d may be formed of a material different from that of the second pattern layer 48 and have the same thickness as the second pattern layer 48. The upper dummy pattern layer 51d may be formed of the same material and/or have the same thickness as the third pattern layer 51.

The intermediate dummy pattern layer 48d may include a first layer 49a, a second layer 49b, and a third layer 49c being sequentially stacked.

In some example embodiments, the first layer 49a and the third layer 49c may include the same material, and the second layer 49b may include a material different from the first and third layers 49a and 49c. For example, the first layer 49a and the third layer 49c may be formed of a silicon oxide, and the second layer 49b may be formed of a silicon nitride or polysilicon.

Figure 5:
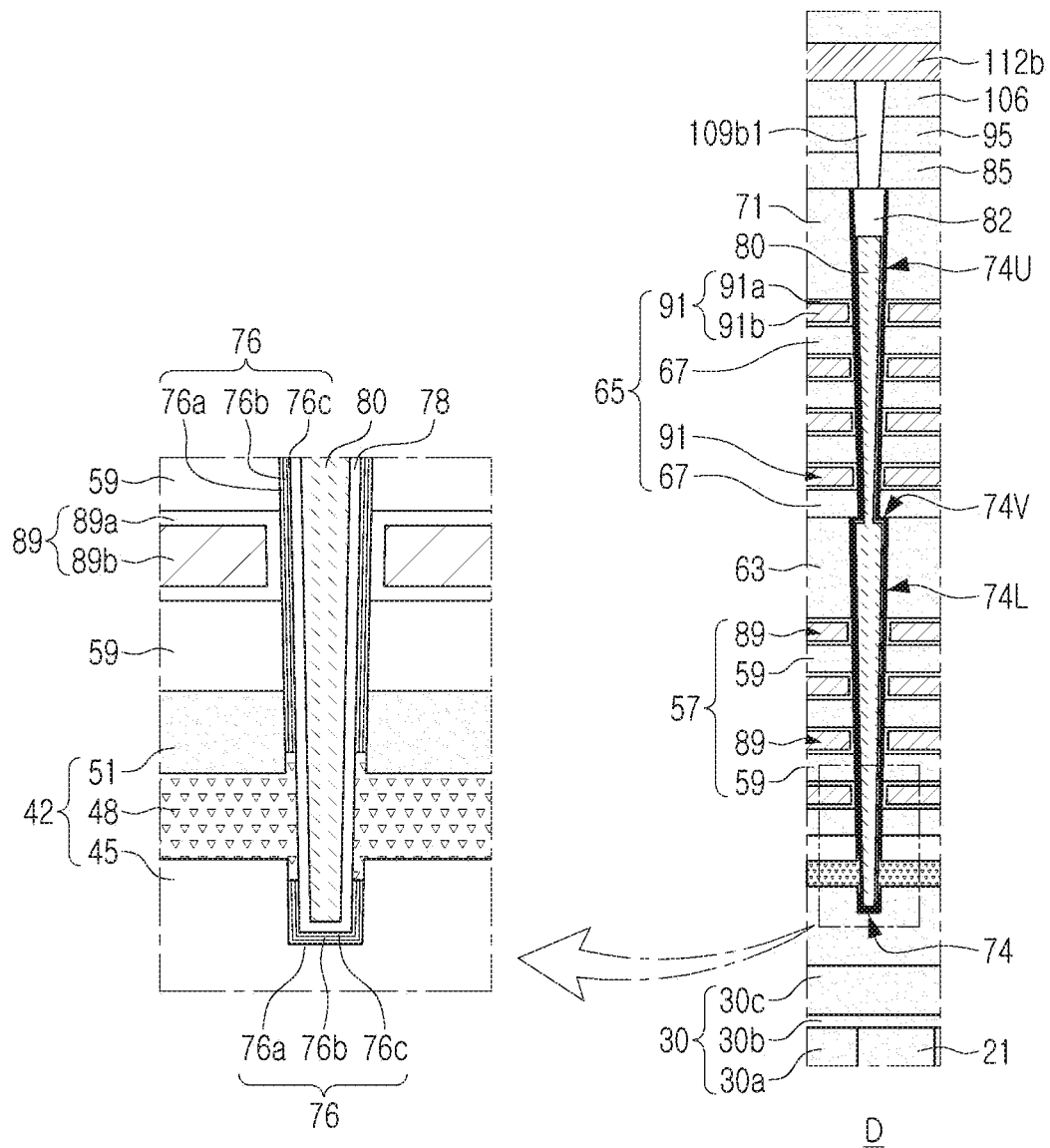
FIG. 5 is a partially enlarged view of a part of a semiconductor device according to some example embodiments.

Next, an example of the memory vertical structure 74 described above with reference to FIGS. 1A and 1B will be described with reference to FIG. 5. FIG. 5 is an enlarged view of a portion indicated by "D" in FIG. 1B.

Referring to FIGS. 1A, 1B, and 5, the memory vertical structure 74 may extend into the pattern structure 42 sequentially through the upper capping insulating layer 71, the upper stacked structure 65, the lower capping insulating layer 63, and the lower stacked structure 57.

The memory vertical structure 74 may extend into the first pattern layer 45 sequentially through the third pattern layer 51 and the second pattern layer 48. The memory vertical structure 74 may include a core region 80, a channel layer 78, a channel pad 82, and a data storage structure 76.

The channel layer 78 may cover side and bottom surfaces of the core region 80. The channel layer 78 may be formed of a semiconductor material such as silicon. The channel pad 75 may be disposed on the core region 80 and may be in contact with the channel layer 78. The core region 80 may be formed of an insulating material such as a silicon oxide or an insulating material having voids formed therein. The channel pad 82 may be formed of polysilicon having an N-type conductivity type.

The data storage structure 76 may be disposed on an outer surface of the channel layer 78. A portion of the data storage structure 76 may be interposed between the channel layer 78 and the first pattern layer 45. The second pattern layer 48 may be in contact with the channel layer 78 through the data storage structure 76. A portion of the data storage structure 76 may be interposed between the third pattern layer 51 and the channel layer 78.

The data storage structure 76 may include is a first dielectric layer 76a, a second dielectric layer 76c, and a data storage layer 75b between the first dielectric layer 76a and the second dielectric layer 76c. At least one of the first and second dielectric layers 76a and 76c may include a silicon oxide and/or a high-k dielectric.

In some example embodiments, the data storage layer 76b may include regions capable of storing information in a semiconductor device, such as a NAND flash memory device. For example, the data storage layer 76b may include regions capable of storing information between gate layers which may be a word line among the lower and upper gate layers 89 and 91 and the channel layer 78. The data storage layer 76b may include a material capable of trapping charge, for example, a silicon nitride. The regions of the data storage layer 76b capable of storing information between the gate layers which may be a word line among the lower and upper gate layers 89 and 91 and the channel layer 78 may configure memory cells. A plurality of memory cells sequentially arranged in a vertical direction may be disposed in one memory vertical structure 74. Such a memory vertical structure 74 may be provided in plurality in the memory cell array region MCA. Accordingly, the memory cell array region MCA including memory cells arranged three-dimensionally on the pattern structure 42 may be disposed.

Each of the lower gate layers 89 may include a first lower gate layer 89a and a second lower gate layer 89b. The first lower gate layer 89a may cover upper and lower surfaces of the second lower gate layer 89b and extend between the memory vertical structure 74 and a side surface of the second lower gate layer 89b. Each of the upper gate layers 91 may include a first upper gate layer 91a and a second upper gate layer 91b. The first upper gate layer 91a may cover upper and lower surfaces of the second upper gate layer 91b and extend between the memory vertical structure 74 and a side surface of the second upper gate layer 91b.

In some example embodiments, the first lower gate layer 89a and the first upper gate layer 91a may include a dielectric material, and the second lower gate layer 89b and the second upper gate layer (91b) may include a conductive material. For example, the first lower gate layer 89a and the first upper gate layer 91a may include a high-k dielectric such as AlO, and the second lower gate layer 89b and the second upper gate layer 91b may include a conductive material such as TiN, WN, Ti, W, doped polysilicon, and a metal-semiconductor compound.

In some example embodiments, the first lower gate layer 89a and the first upper gate layers 91a may include a first conductive material (e.g., TiN, WN, etc.), and the second lower gate layer 89b and the second upper gate layer 91b may include a second conductive material (e.g., Ti, W, etc.) different from the first conductive material.

In some example embodiments, each of the lower and upper gate layers 89 and 91 may be formed of doped polysilicon, a metal-semiconductor compound (e.g., TiSi, TaSi, CoSi, NiSi or WSi), a metal nitride (e.g., TiN, TaN or WN), or a metal (e.g., Ti or W).

The memory vertical structure 74 may include a lower vertical portion 74L penetrating the lower gate layers 89 of the first stacked structure 57, an upper vertical portion 74U penetrating the upper gate layers of the second stacked structure 65, and an intermediate portion 74V between the lower vertical portion 74L and the upper vertical portion 74U.

In the memory vertical structure 74, the intermediate portion 74V may be a width changing portion, a step portion, an inflection portion, or a bent portion. For example, in the memory vertical structure 74, the intermediate portion 74V may be a portion including a side surface having at least one bent portion.

Figure 6:
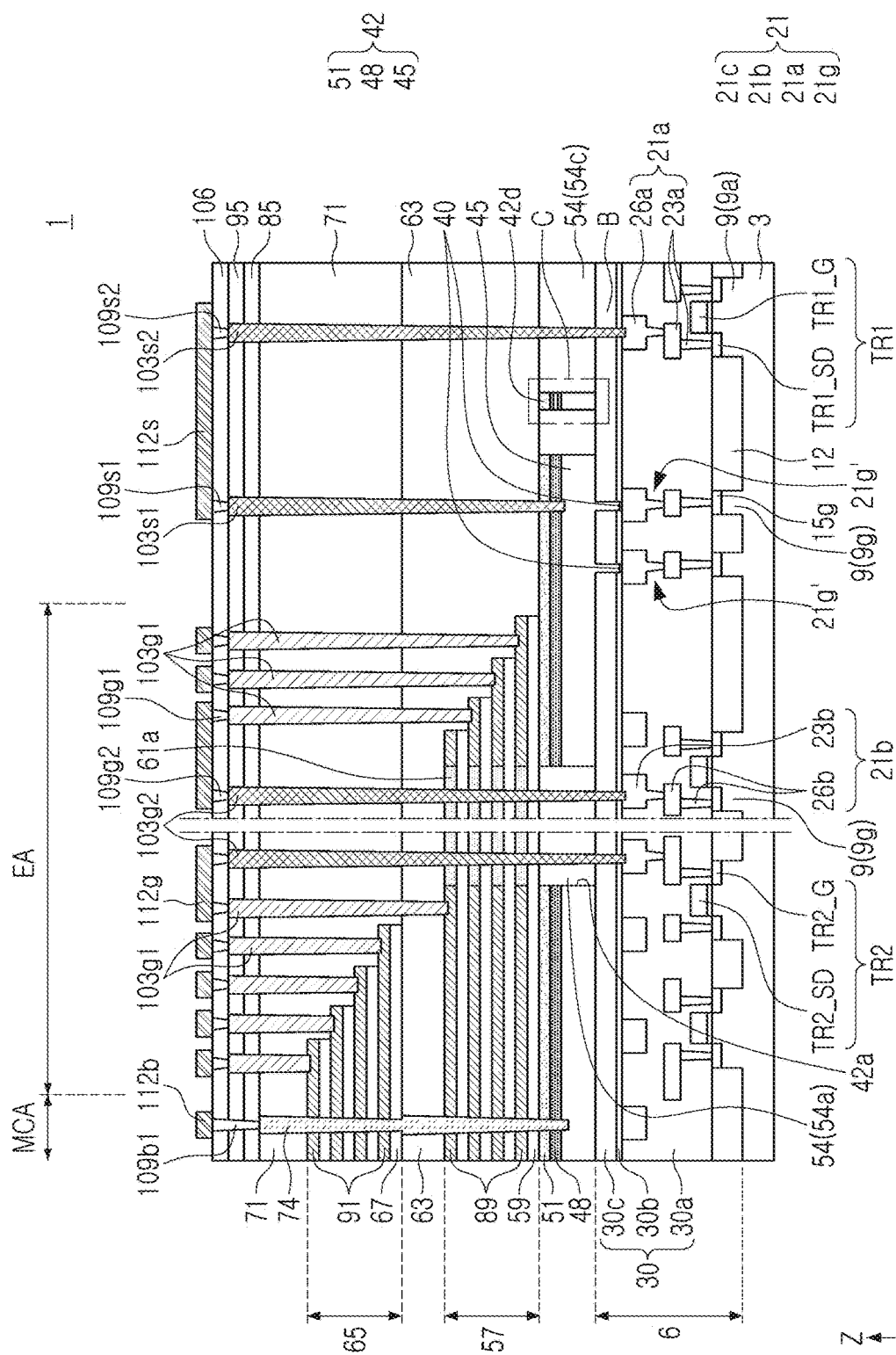
FIG. 6 is a cross-sectional view schematically illustrating a modification of a semiconductor device according to some example embodiments.

Referring back to FIG. 1A, one ground wiring structure 21g is illustrated, but the example embodiments are not limited thereto. Hereinafter, some example embodiments in which a plurality of the ground wiring structures (21g in FIG. 1A) are disposed will be described with reference to FIG. 6. FIG. 6 is a schematic cross-sectional view illustrating a region corresponding to the region illustrated in FIG. 1A.

Referring to FIG. 6, the ground wiring structure (21g in FIG. 1A) described above with reference to FIG. 1A on the substrate 3 may be replaced with a plurality of ground wiring structures (21g' of FIG. 6). Therefore, since the graphene-like carbon material layer 40 is formed on each of the plurality of ground wiring structures (21g' in FIG. 6), a plurality of layers may be disposed. Accordingly, the first pattern layer 45 may be grounded with the plurality of ground wiring structures (21g' in FIG. 6) through the plurality of graphene-like carbon material layers 40. The first pattern layer 45 may include a plurality of the via portions (45V in FIG. 2) as described above with reference to FIG. 2 to be in contact with the plurality of graphene-like carbon material layers 40.

Figure 7:
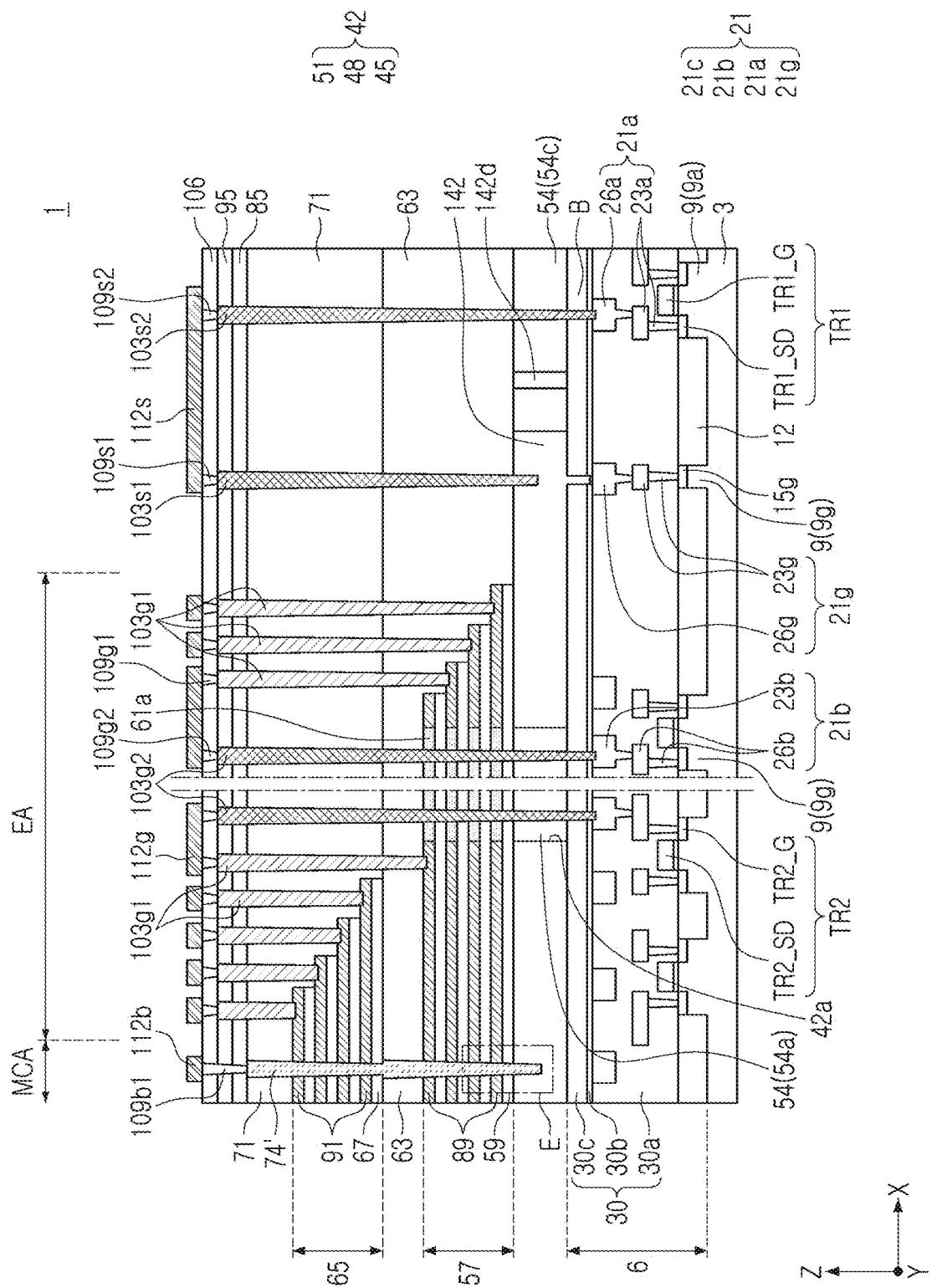
FIG. 7 is a cross-sectional view schematically illustrating a modification of a semiconductor device according to some example embodiments.

Referring again to FIG. 1A, the pattern structure 42 may include the first to third pattern layers 45, 48 and 51, but the example embodiments are not limited thereto. Hereinafter, a modification of the pattern structure (42 in FIG. 1A), the memory vertical structure (74 in FIG. 5), and the dummy pattern (42d in FIGS. 1A and 4B) will be described with reference to FIGS. 7 and 8. FIG. 7 is a schematic cross-sectional view illustrating a region corresponding to the region illustrated in FIG. 1A, and FIG. 8 is a partially enlarged view of a region indicated by "E" in FIG. 7.

Figure 8:
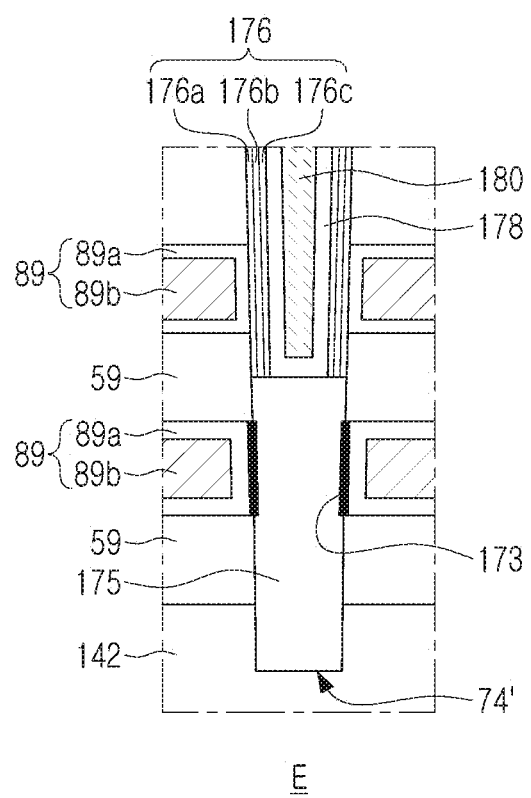
FIG. 8 is a partially enlarged view of a part of FIG. 7.

Referring to FIGS. 7 and 8, the pattern structure (42 in FIGS. 1A and 1B) including the first to third pattern layers (45, 48, and 51 in FIGS. 1A and 1B) described above may be replaced with a single layer pattern structure 142 as illustrated in FIG. 7. The dummy pattern (42d in FIGS. 1A and 4B) described above may be replaced with a single layer dummy pattern 142d.

The lower portion of the memory vertical structure (74 in FIG. 5) described above may be replaced with a lower portion of the memory vertical structure 74' as illustrated in FIG. 8. For example, the lower portion of the memory vertical structure 74' may include a lower semiconductor layer 175 disposed to be in contact with the pattern structure 142 and extending in the vertical direction Z, a core region 180 spaced apart from the lower semiconductor layer 175 on the lower semiconductor layer 175, a channel layer 178 interposed between the core region 180 and the lower semiconductor layer 175 and extending to a side surface of the core region 180, and a data storage structure 176 covering an outer surface of the channel layer 178. The data storage structure 176 may include a first dielectric layer 176a, a data storage layer 176b, and a second dielectric layer 176c, like the data storage structure (76 in FIG. 5) in FIG. 3. A gate insulating layer 173 may be disposed between the lowermost lower gate layer among the lower gate layers 89 and the lower semiconductor layer 175 of the memory vertical structure 74'.

Figure 9:
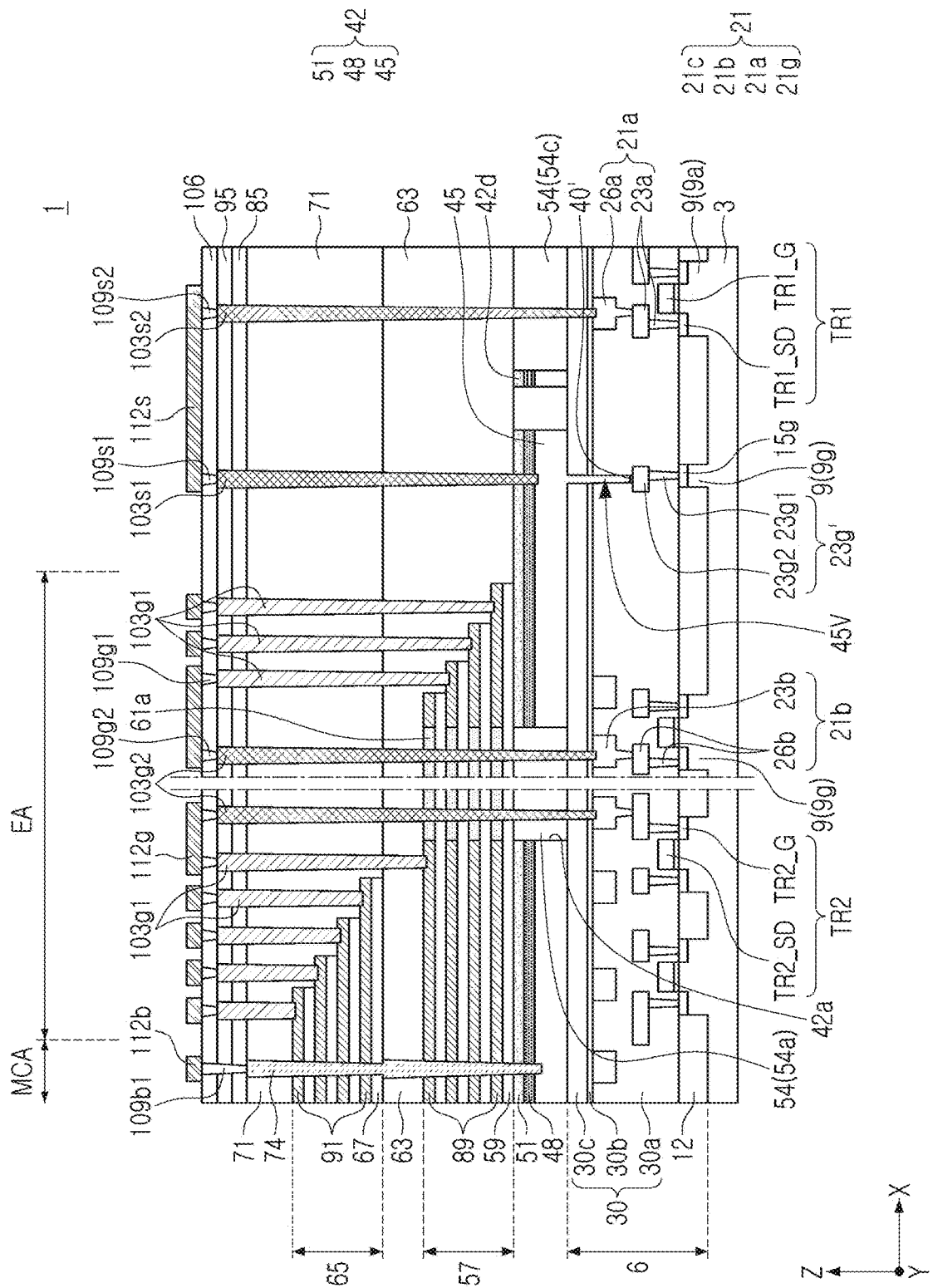
FIG. 9 is a cross-sectional view schematically illustrating a modification of a semiconductor device according to some example embodiments.

Next, a modification of the ground wiring structure (21g in FIG. 1A) described above will be described with reference to FIG. 9. FIG. 9 is a schematic cross-sectional view illustrating a region corresponding to the region illustrated in FIG. 1A.

Referring to FIG. 9, the ground wiring structure (21g in FIG. 1A) including the ground lower wiring structure (23g in FIG. 1A) and the ground upper wiring structure (26g in FIG. 1A) described above may be replaced with the ground wiring structure 23g' without the ground upper wiring structure (26g in FIG. 1A). The ground wiring structure 23g' may include a ground pad portion 23g2 and a ground via portion 23g1 disposed under the ground pad portion 23g2 and electrically connected to the ground impurity region 15g.

The ground wiring structure 23g' may be located at a height level substantially the same as the ground lower wiring structure (23g in FIG. 1A) described above with reference to FIG. 1A. Therefore, the ground pad portion 23g2 of the ground wiring structure 23g' may be located at a height level lower than the circuit pad portion (26Pa in FIG. 4A) of the first to third circuit wiring structures 21a, 21b, and 21c.

The ground pad portion 23g2 of the ground wiring structure 23g' may include the ground lower gap fill layer (24b in FIG. 2) and the ground lower barrier layer (24a in FIG. 2) covering lower and side surfaces of the ground lower gap fill layer (24b in FIG. 2) described above with reference to FIG. 2.

A graphene-like carbon material layer 40' corresponding to the graphene-like carbon material layer (40 in FIG. 2) described above with reference to FIG. 2 may be disposed on the ground wiring structure 23g'. The graphene-like carbon material layer 40' may be in contact with the ground lower gap fill layer (24b in FIG. 2) and may be spaced apart from the ground lower barrier layer (24a in FIG. 2). The graphene-like carbon material layer 40' may be located at a height level lower than the circuit pad portion (26Pa in FIG. 4A) of the first to third circuit wiring structures 21a, 21b, and 21c. The first pattern layer 45 may include a via portion 45V' extending into the first lower insulating layer 30a sequentially through the second lower insulating layer 30c and the etch stop layer 30b so as to be in contact with the graphene-like carbon material layer 40'.

Next, an example of a method of forming a semiconductor device according to some example embodiments will be described with reference to FIGS. 10A to 16B. In FIGS. 10A to 16B, FIGS. 10A, 11A, 12, 13, 14A, 15A, and 16A are cross-sectional views schematically illustrating a method of forming a region corresponding to FIG. 1A, and FIGS. 10B, 11B, 14B, 15B, and 16B are cross-sectional views schematically illustrating a method of forming a region corresponding to FIG. 1B.

Figure 10A:
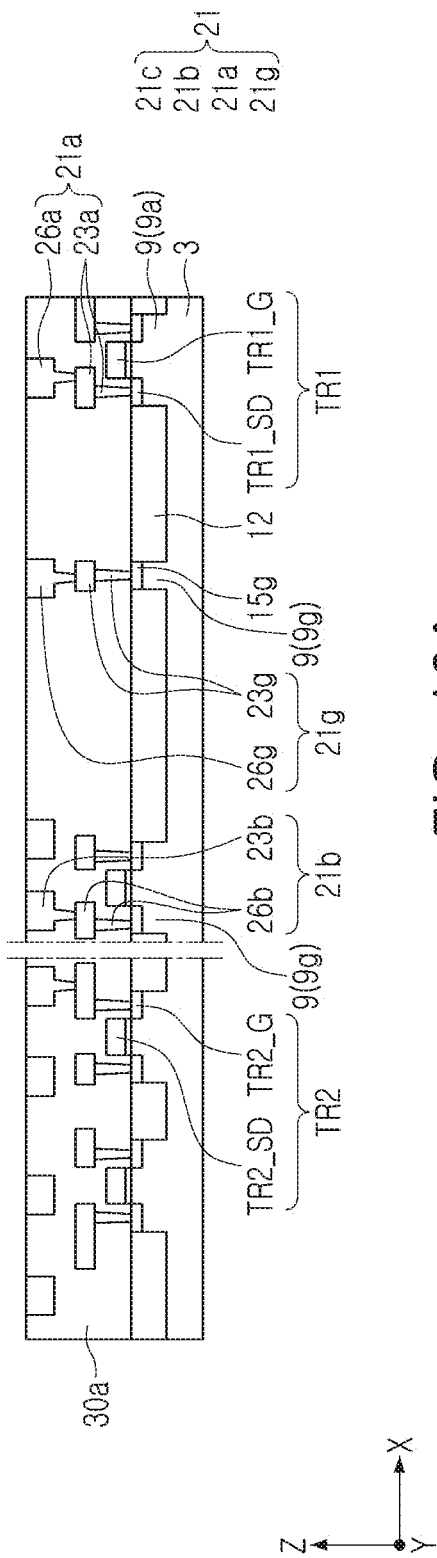
FIGS. 10A through 16B are schematic cross-sectional views illustrating an example of a method of forming a semiconductor device according to some example embodiments.
Figure 10B:
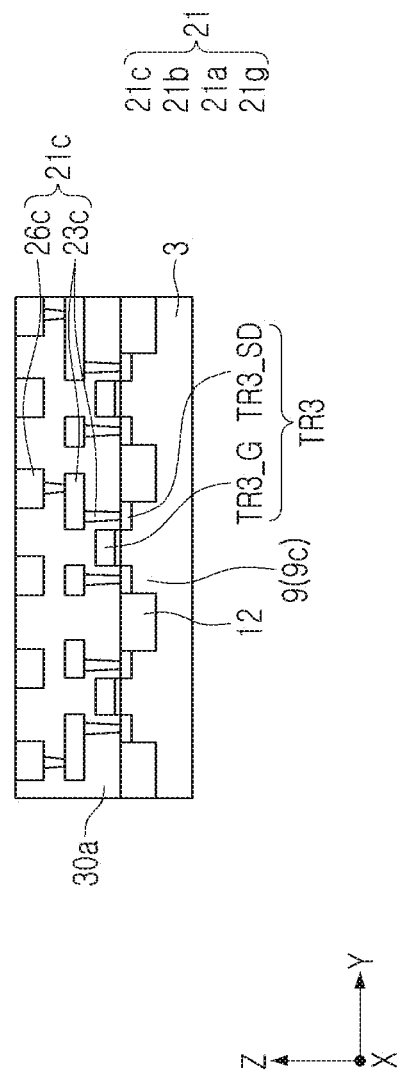

Referring to FIGS. 10A and 10B, a substrate 3 may be prepared. A isolation layer 12 defining active regions 9 may be formed on the substrate 3. The active regions 9 may include a ground active region 9g and circuit active regions 9a to 9c.

A plurality of circuit elements TR1 to TR3 may be formed on the substrate 3. The forming of a plurality of circuit elements TR1 to TR3 may include forming circuit gates TR1_G, TR2_G, and TR2_G and circuit source/drain regions TR1_SD, TR2_SD, and TR3_SD. The circuit gates TR1_G, TR2_G, and TR3_G may be formed on the circuit active regions 9a to 9c, and the circuit source/drain regions TR1_SD, TR2_SD, and TR3_SD may be formed in the circuit active regions 9a to 9c.

A ground impurity region 12g may be formed in the ground active region 9g. The ground impurity region 12g may have an N-type conductivity type. The ground impurity region 12g may be formed together with circuit source/drain regions having an N-type conductivity type among the circuit source/drain regions TR1_SD, TR2_SD, and TR3_SD.

A device wiring structure 21 and a first lower insulating layer 30a may be formed on the substrate 3 on which the plurality of circuit elements TR1 to TR3 are formed. The device wiring structure 21 may include a ground wiring structure 21g and circuit wiring structures 21a, 21b, and 21c. The forming of the device wiring structure 21 and the first lower insulating layer 30a may include repeating a damascene process. The damascene process may include forming an insulating layer, forming a damascene opening penetrating the insulating layer, forming a barrier layer conformally covering the insulating layer and the damascene opening, forming a gap fill layer on the barrier layer, and planarizing the gap-fill layer and the barrier layer until an upper surface of the insulating layer is exposed. The ground wiring structure 21g may be formed of a ground lower wiring structure 23g formed by the damascene process and a ground upper wiring structure 26g formed by the damascene process. The circuit wiring structures 21a, 21b, and 21c may include circuit lower wiring structures 23a, 23b, and 23c formed by the damascene process and upper wiring structures 26a, 26b, and 26c formed by the damascene process.

Figure 11A:
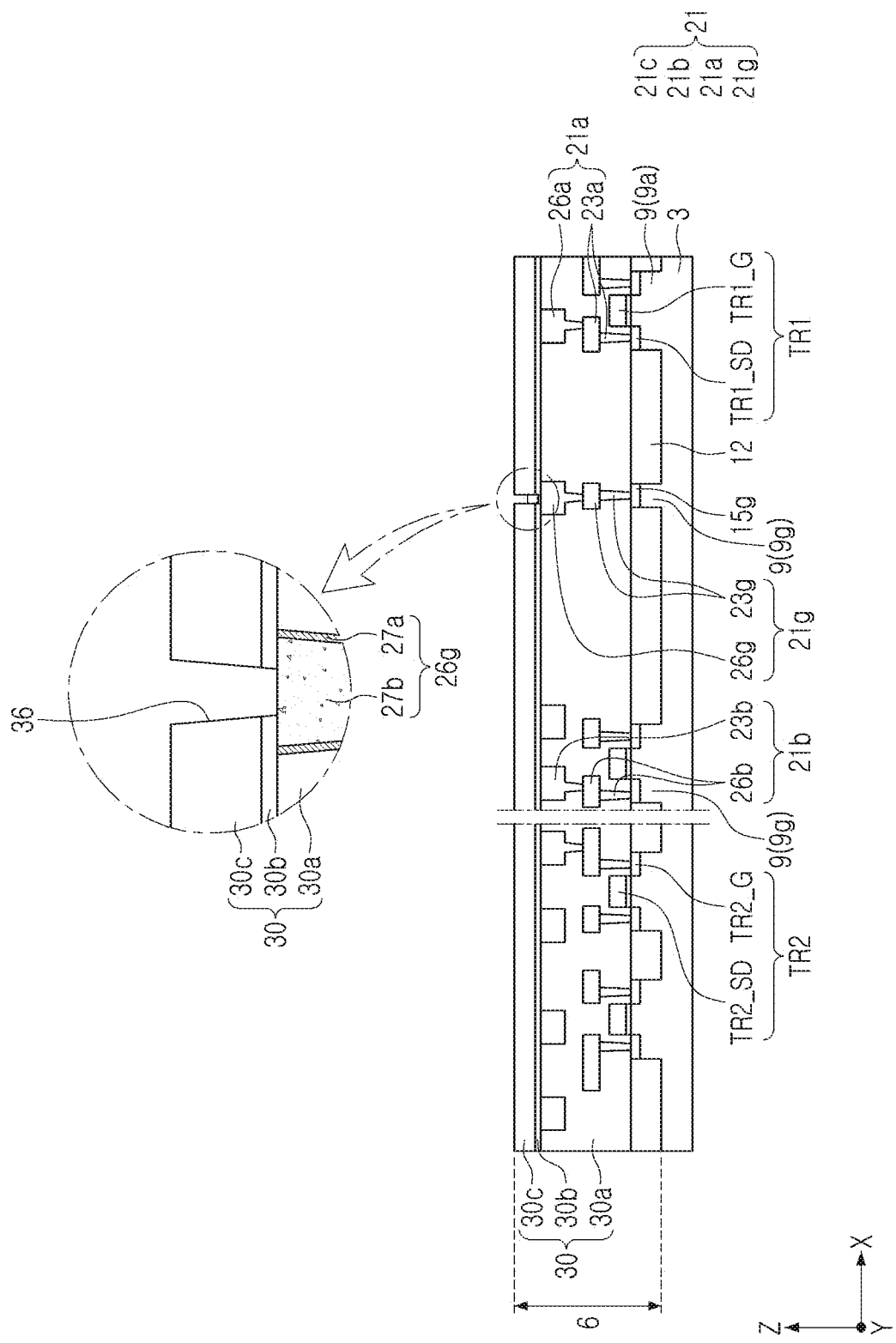
Figure 11B:
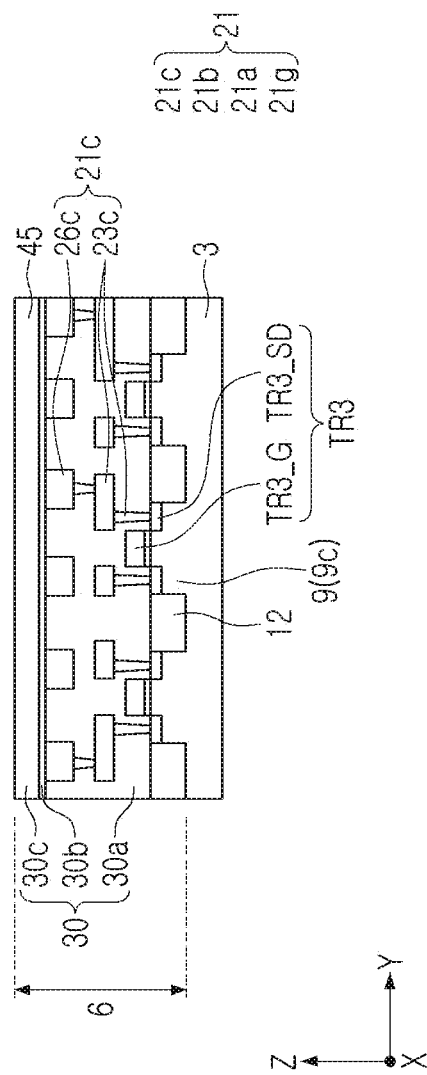

Referring to FIGS. 11A and 11B, an etch stop layer 30b covering the wiring structure 21 and the first lower insulating layer 30a may be formed, and a second lower insulating layer 30c may be formed on the etch stop layer 30b. The etch stop layer 30b may be formed of an insulating material having etch selectivity with the second lower insulating layer 30c.

A via hole 36 exposing a portion of the ground pad portion 26Pg of the ground upper wiring structure 26g of the ground wiring structure 21g may be formed by patterning the second lower insulating layer 30c and the etch stop layer 30b.

The ground pad portion 26Pg may include a ground upper gap fill layer 27b and a ground upper barrier layer 27a covering at least a side surface of the ground upper gap fill layer 27b.

The via hole 36 may expose a portion of an upper surface of the ground upper gap fill layer 27b. The via hole 36 may not expose the ground upper barrier layer 27a.

Figure 12:
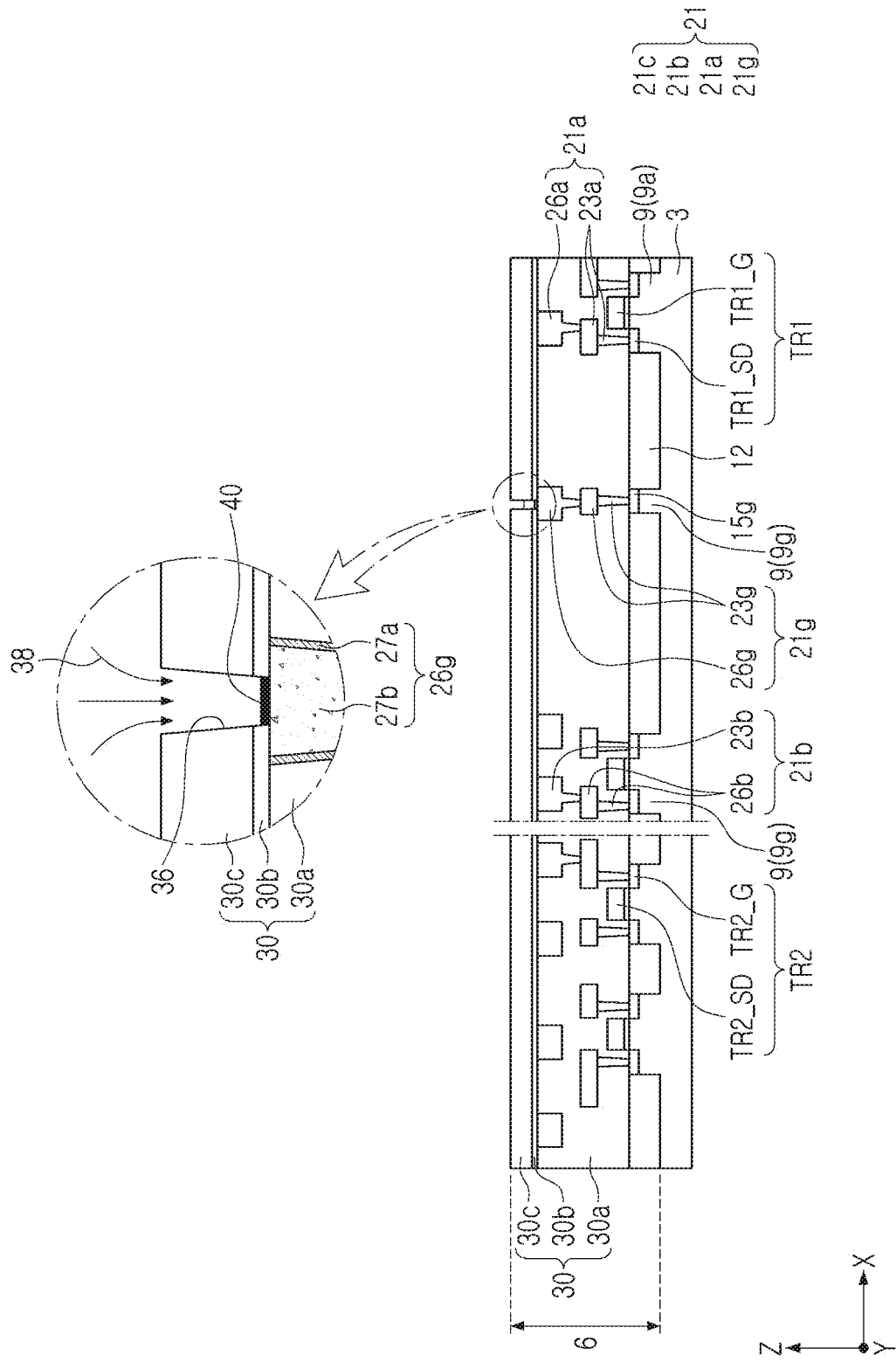

Referring to FIG. 12, a buffer conductive layer 40 may be formed on the ground upper gap fill layer 27b exposed by the via hole 36. The buffer conductive layer 40 may be formed of a graphene-like carbon material layer. Hereinafter, the buffer conductive layer 40 will be referred to as a graphene-like carbon material layer.

The graphene-like carbon material layer 40 may grow from a surface of the ground upper gap fill layer 27b. The graphene-like carbon material layer 40 may be spaced apart from the ground upper barrier layer 27a.

The graphene-like carbon material layer 40 may be formed using a CVD process 38 using a precursor containing carbon. For example, the forming of the graphene-like carbon material layer 40 may include performing the CVD process 38 in a process atmosphere including Ar gas and $H_2$ gas together with a carbon-based precursor. In some example embodiments, the carbon-based precursor may be $CH_4(C_2H_4)$, but the example embodiments are not limited thereto.

In some example embodiments, the graphene-like carbon material layer 40 may have a thickness smaller than the etch stop layer 30b.

In some example embodiments, the graphene-like carbon material layer 40 may have substantially the same thickness as the etch stop layer 30b.

In some example embodiments, the graphene-like carbon material layer 40 may have a thickness larger than the etch stop layer 30b.

Figure 13:
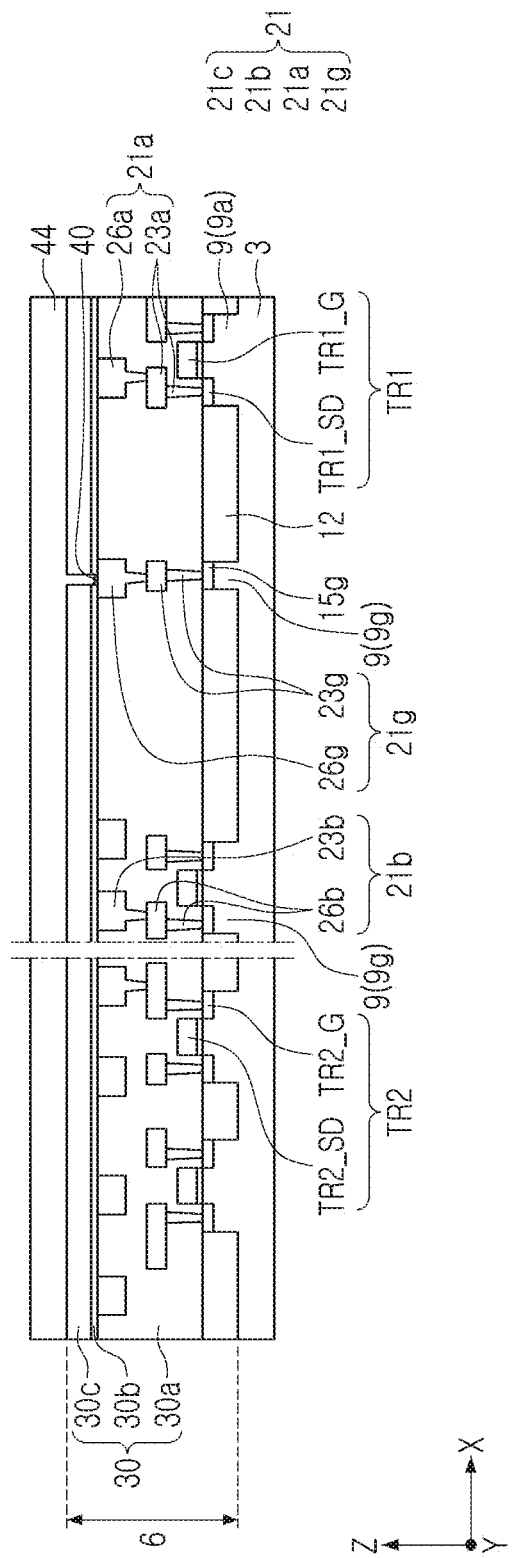

Referring to FIG. 13, a first pre-pattern layer 44 filling the via hole 36 and covering the second lower insulating layer 30c may be formed. The first pre-pattern layer 44 may be in contact with the graphene-like carbon material layer 40. The first pre-pattern layer 44 may be formed of a polysilicon layer. The first pre-pattern layer 44 may be formed of polysilicon having an N-type conductivity type.

Figure 14A:
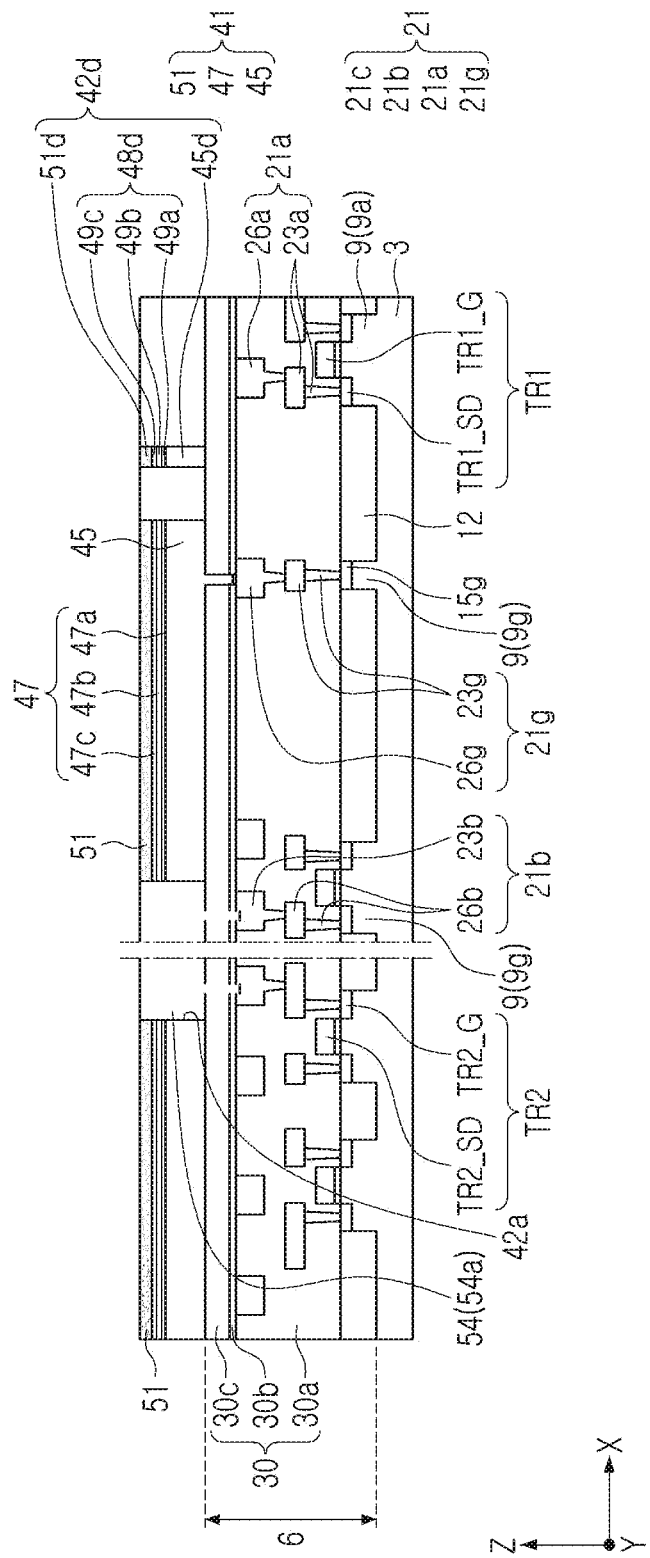
Figure 14B:
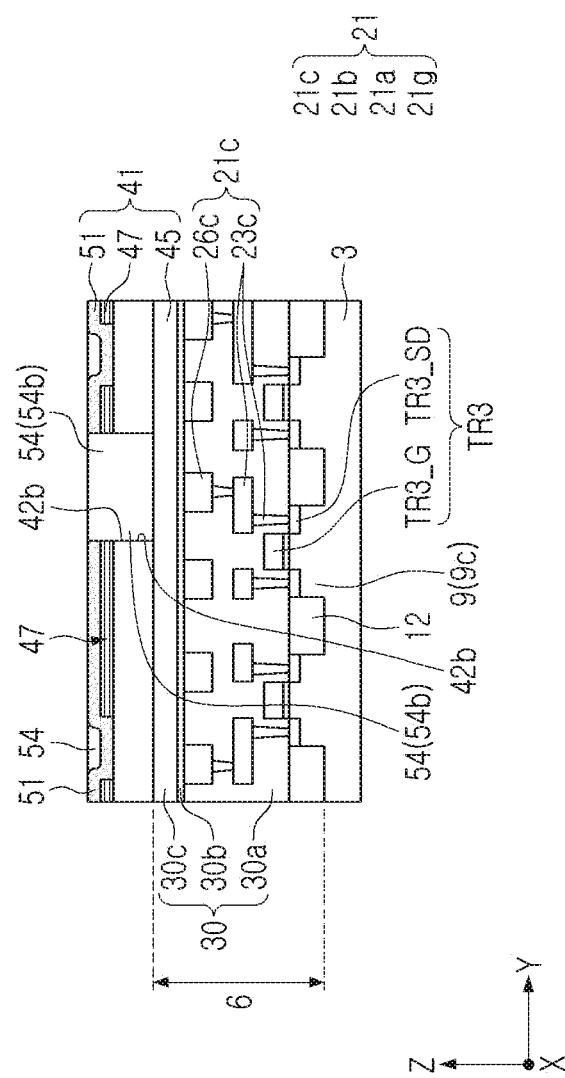

Referring to FIGS. 14A and 14B, a pre-sacrificial pattern layer having an opening 48a may be formed on the first pre-pattern layer (44 in FIG. 13), and a third pre-pattern layer may be formed on the pre-sacrificial pattern layer.

Subsequently, the first pre-pattern layer (44 in FIG. 13), the pre-sacrificial pattern layer, and the third pre-pattern layer may be patterned to simultaneously form a pre-pattern structure 41 having a first inner opening 42a and a second inner opening 42b and a dummy pattern 42d.

The pre-pattern structure 41 may be formed of a first pattern layer 45, a sacrificial pattern layer 47, and a third pattern layer 51 being sequentially stacked. The third pattern layer 51 may be formed of polysilicon. The sacrificial pattern layer 47 may include a first layer 47a, a second layer 47b, and a third layer 47c being sequentially stacked. The first layer 47a and the third layer 47c may be formed of a silicon oxide, and the second layer 47b may be formed of a silicon nitride or polysilicon.

The dummy pattern 42d may include a lower dummy pattern layer 45d, an intermediate dummy pattern layer 48d, and an upper dummy pattern layer 51d being sequentially stacked. The intermediate dummy pattern layer 48d may include a first layer 49a, a second layer 49b, and a third layer 49c corresponding to the first layer 47a, the second layer 47b, and the third layer 47c, respectively.

An intermediate insulating structure 54 may be formed. The forming of the intermediate insulating structure 54 may include forming an intermediate insulating layer and planarizing the intermediate insulating layer until upper surfaces of the pattern structure 42 and the dummy pattern 42d are exposed. In the intermediate insulating structure 54, an intermediate insulating layer formed in the first inner opening 42a of the pattern structure 42 may be referred to as a first intermediate insulating layer 54a, an intermediate insulating layer formed in the second inner opening 42b of the pattern structure 42 may be referred to as a second intermediate insulating layer 54b, and an intermediate insulating layer surrounding an outer surface of the pattern structure 42 and surrounding a side surface of the dummy pattern 42d may be referred to as a third intermediate insulating layer 54c.

Figure 15A:
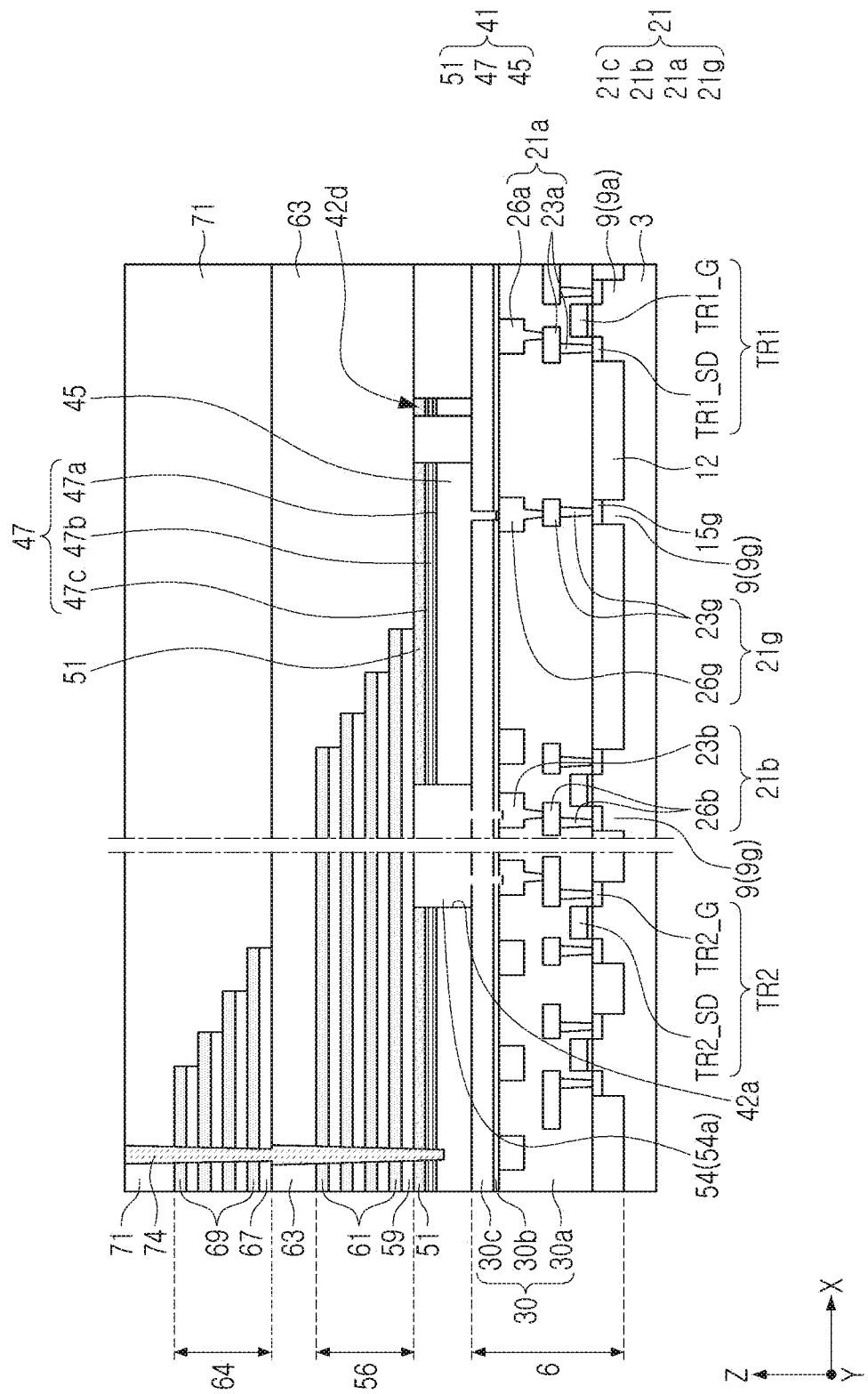
Figure 15B:
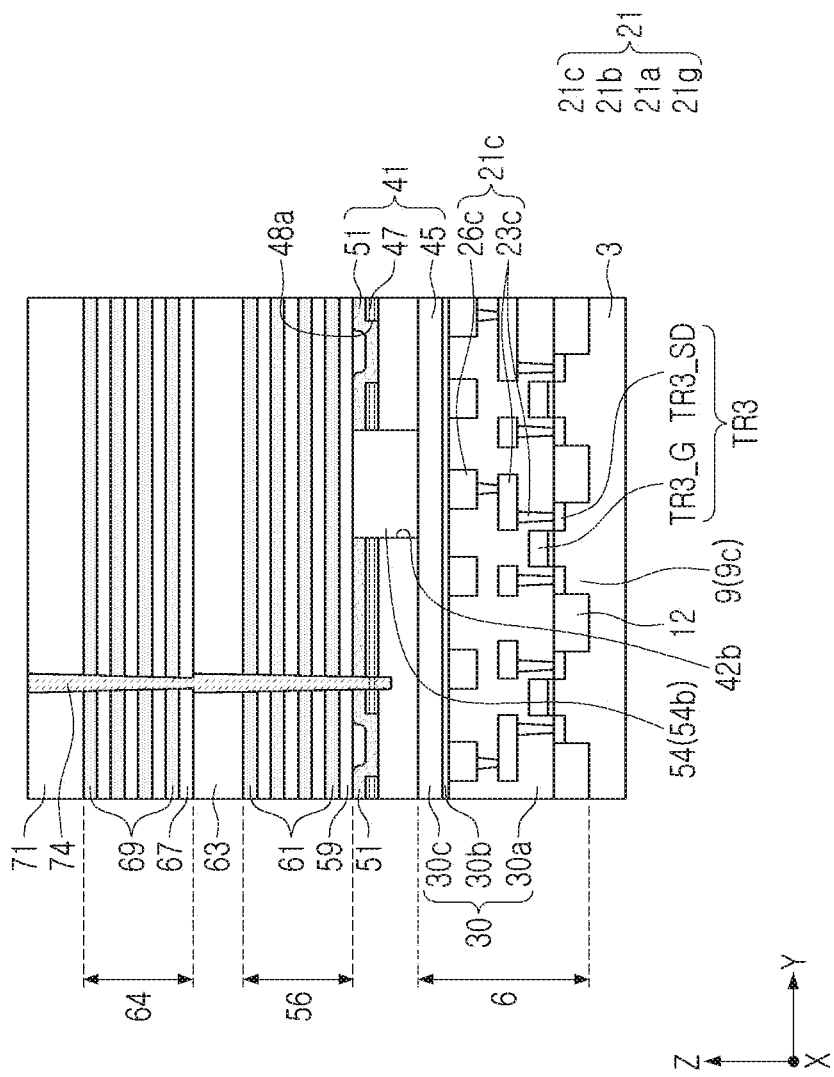

Referring to FIGS. 15A and 15B, a pre-lower stacked structure 56 may be formed on the pattern structure 42. The forming of the pre-lower stacked structure 56 may include forming lower interlayer insulating layers 59 and first mold layers 61 being alternately repeatedly stacked and patterning the lower interlayer insulating layers 59 and the first mold layers 61 to form a step structure. The lower interlayer insulating layers 59 may be formed of a silicon oxide, and the first mold layers 61 may be formed of a silicon nitride. A lower capping insulating layer 63 may be formed on the pre-lower stacked structure 56. The lower capping insulating layer 63 may be formed of a silicon oxide.

A pre-upper stacked structure 64 may be formed on the lower capping insulating layer 63. The forming of the pre-upper stacked structure 64 may include forming upper interlayer insulating layers 67 and second mold layers 69 being alternately repeatedly stacked and patterning the upper interlayer insulating layers 67 and the second mold layers 69 to form a step structure. The upper interlayer insulating layers 67 may be formed of a silicon oxide, and the second mold layers 69 may be formed of a silicon nitride. An upper capping insulating layer 71 may be formed on the pre-upper stacked structure 64. The upper capping insulating layer 71 may be formed of a silicon oxide.

A memory vertical structure 74 extending into the pattern structure 42 sequentially through the upper capping insulating layer 71, the pre-upper stacked structure 64, the lower capping insulating layer 63, and the pre-lower stacked structure 56. For example, before forming the pre-upper stacked structure 64, a lower sacrificial vertical structure penetrating the lower capping insulating layer 63 and the pre-lower stacked structure 56 may be formed, an upper memory hole sequentially penetrating the upper capping insulating layer 71 and the pre-upper stacked structure 64 and exposing the lower sacrificial vertical structure may be formed, the exposed lower sacrificial vertical structure may be removed to form a lower memory hole, and the memory vertical structure 74 filling the lower and upper memory holes may be formed.

In some example embodiments, the memory vertical structure 74 may include a channel layer (78 in FIG. 5) that may be formed of a semiconductor material and a data storage layer (76b in FIG. 5) that may store information.

Figure 16A:
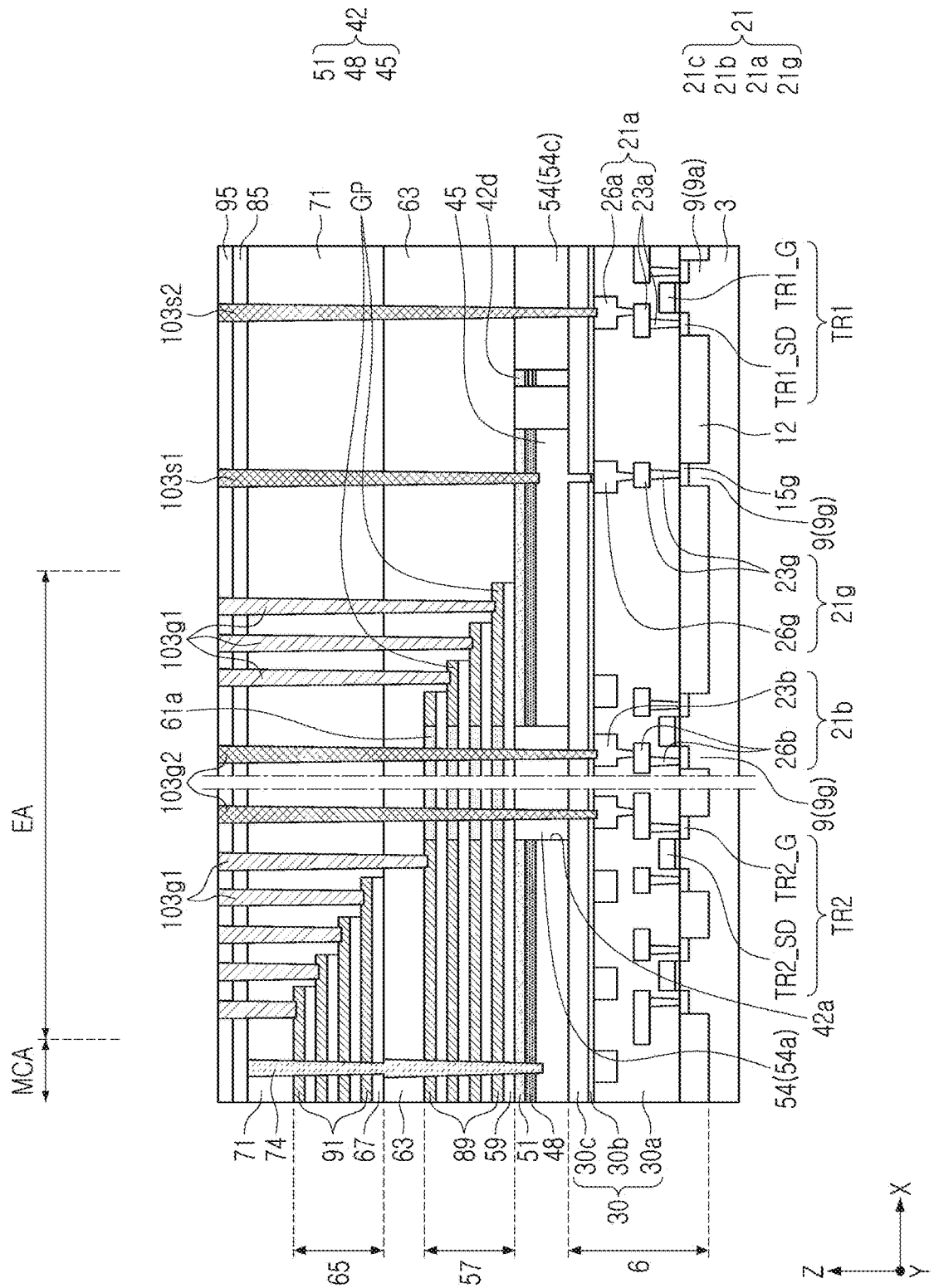
Figure 16B:
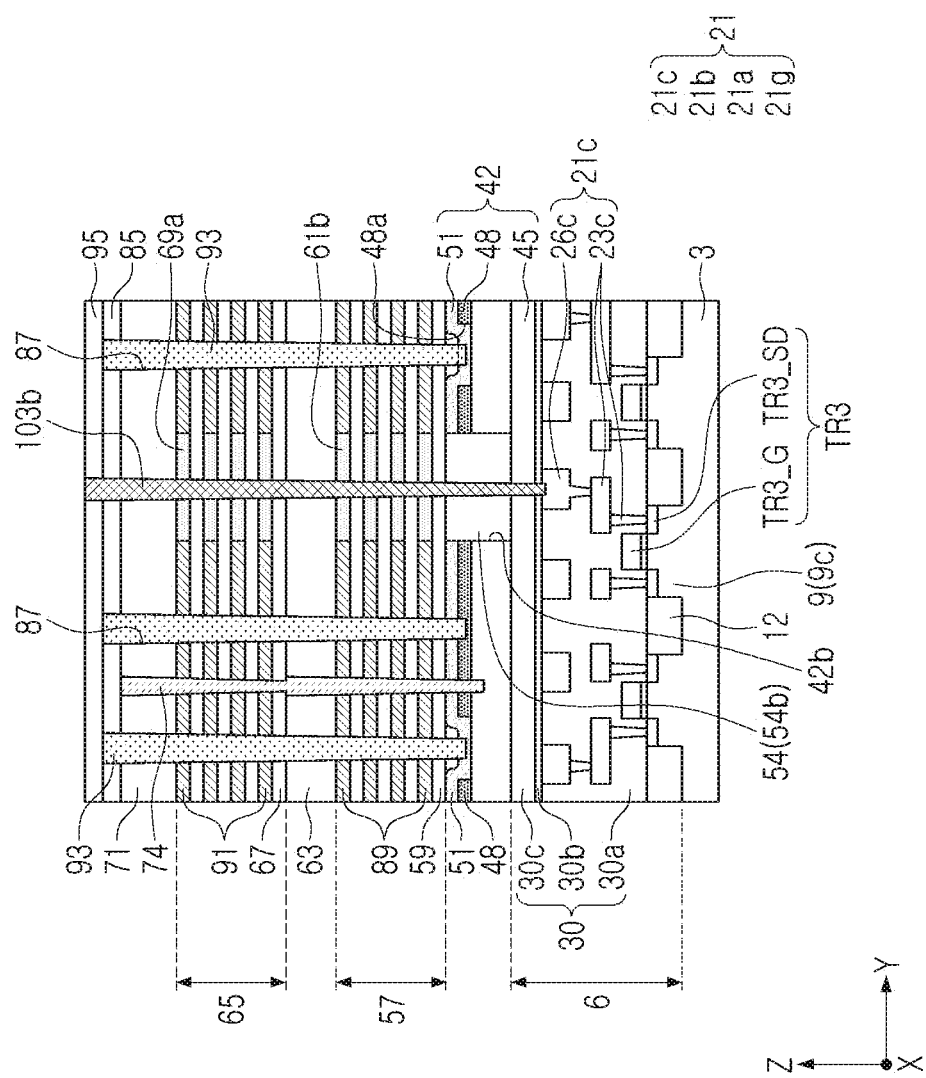

Referring to FIGS. 16A and 16B, a first upper insulating layer 85 may be formed. Isolation trenches 87 extending into the first pre-pattern layer 44 sequentially through the first upper insulating layer 85, the upper capping insulating layer 71, the pre-upper stacked structure 64, the lower capping insulating layer 63, and the pre-lower stacked structure 56 may be formed. At least some of the isolation trenches 87 may expose the sacrificial pattern layer 47.

The sacrificial pattern layer 47 exposed by the isolation trenches 87 may be removed to form an empty space, and a second pattern layer 48 may be formed in the empty space. The second pattern layer 48 may be formed of polysilicon having an N-type conductivity type.

Before removing the sacrificial pattern layer 47 exposed by the isolation trenches 87, a sacrificial spacer covering side walls of the isolation trenches 87 may be formed, and after the second pattern layer 48 is formed, the sacrificial spacer may be removed to expose the lower and second mold layers 61 and 69.

The first and second mold layers 61 and 69 exposed by the isolation trenches 87 may be partially removed to form empty spaces, and gate layers 89 and 91 may be formed within the empty spaces. Some of the first mold layers 61 may remain to be formed as the first lower mold layers 61a and the second lower mold layers 61b, and some of the second mold layers 69 may remain to be formed as upper mold layers 69a.

Separation structures 93 filling the isolation trenches 87 may be formed. A second upper insulating layer 95 may be formed on the first upper insulating layer 85. First gate contact plugs 103g1 extending downward sequentially through the second upper insulating layer 95 and the first upper insulating layer 85 and electrically connected to gate pads of the gate layers 89 and 91 may be formed. A first source contact plug 103s1 extending downward sequentially through the second upper insulating layer 95 and the first upper insulating layer 85 and electrically connected to the pattern structure 42 may be formed. Sequentially penetrating the second upper insulating layer 95 and the first upper insulating layer 85 downward, a second source contact plug 103s2 in contact with the first circuit upper wiring structure 26a, a second gate contact plug 103g2 in contact with the second circuit upper wiring structure 26b, and a bit line contact plug 103b in contact with the third circuit upper wiring structure 26c may be formed.

Referring back to FIGS. 1A and 1B, a third upper insulating layer 106 may be formed on the second upper insulating layer 95.

A first bit line connecting plug 109b1 penetrating the first to third upper insulating layers 85, 95, and 106 and electrically connected to the memory vertical structure 74 may be formed.

Penetrating the third upper insulating layer 106, a first gate connection plug 109g1 electrically connected to the first gate contact plug 103g1, a second gate connection plug 109g2 electrically connected to the second gate contact plug 103g2, a first source connection plug 109s1 electrically connected to the first source contact plug 103s1, a second source connection plug 109s2 electrically connected to the second source contact plug 103s2, and a second bit line connection plug 109b2 electrically connected to the bit line contact plug 103b may be formed.

A bit line 112b electrically connected to the first and second bit line connection plugs 109b1 and 109b2, a source connection wiring 112s electrically connected to the first and second source connection plugs 109s1 and 109s2, and a gate connection wiring 112g electrically connected to the first and second gate connection plugs 109g1 and 109g2 may be formed.

According to example embodiments, before forming the first pre-pattern layer (44 in FIG. 13), which may be formed of polysilicon, the graphene-like carbon material layer (40 in FIG. 12) may be formed on a surface of the ground upper gap fill layer (27b in FIG. 11A) exposed by the via hole (36 in FIG. 11A), thereby preventing contamination or a defect of the first pre-pattern layer (44 in FIG. 13). The first pattern layer 45 formed using the first pre-pattern layer (44 in FIG. 13) may be reliably formed, and therefore, a semiconductor device with improved reliability may be provided.

As set forth above, according to example embodiments of the present disclosure, the semiconductor device including a substrate, a wiring structure on the substrate, a pattern layer on the wiring structure, and a buffer conductive layer between the wiring structure and the pattern layer may be provided. The buffer conductive layer may be a graphene-like carbon material layer. The pattern layer may include a plate portion and a via portion extending from the plate portion. The pattern layer may be formed of a polysilicon layer. The polysilicon layer of the pattern layer may be spaced apart from the wiring structure by the graphene-like carbon material layer. Accordingly, the polysilicon layer of the pattern layer may be prevented from being contaminated by a metal material of the wiring structure or an occurrence of a defect in the polysilicon layer due to the metal material of the wiring structure may be prevented. Therefore, the semiconductor device with improved reliability may be provided.

While example embodiments have been illustrated and described above, it will be apparent to those skilled in the art that modifications and variations could be made without departing from the scope of the present disclosure as defined by the appended claims.

What is claimed is:

1. A semiconductor device comprising:
 a substrate;
 a lower structure on the substrate, the lower structure including a first wiring structure, a second wiring structure, and a lower insulating structure covering the first and second wiring structures;
 a first pattern layer including a plate portion and a via portion, the plate portion being on the lower insulating structure and the via portion extending into the lower insulating structure from a lower portion of the plate portion and overlapping the first wiring structure in a vertical direction;
 a graphene-like carbon material layer in contact with the via portion and the first wiring structure, the graphene-like carbon material layer being between the via portion and the first wiring structure;
 gate layers stacked in the vertical direction perpendicular to an upper surface of the substrate and spaced apart from each other on the first pattern layer, the gate layers spaced apart from the first wiring structure in a horizontal direction; and
a memory vertical structure penetrating through the gate layers in the vertical direction,
wherein the plate portion overlaps a portion of the gate layers in the vertical direction and extends beyond the first wiring structure in the horizontal direction opposite the gate layers.

2. The semiconductor device of claim 1, wherein
the via portion includes a polysilicon layer, and
the polysilicon layer of the via portion is in contact with the graphene-like carbon material layer.

3. The semiconductor device of claim 1, wherein
the first wiring structure includes a gap fill layer and a barrier layer covering a side surface and a bottom surface of the gap fill layer, and
the graphene-like carbon material layer is in contact with the gap fill layer and spaced apart from the barrier layer.

4. The semiconductor device of claim 3, wherein
a distance between the graphene-like carbon material layer and the barrier layer is greater than a thickness of the barrier layer.

5. The semiconductor device of claim 3, wherein
the first wiring structure includes a pad portion and a pad via portion extending downward from a lower portion of the pad portion,
a width of the pad portion is greater than a width of the via portion of the first pattern layer adjacent to the pad portion, and
the gap fill layer is in the pad portion and the pad via portion.

6. The semiconductor device of claim 1, wherein
the graphene-like carbon material layer is single layer graphene, multi-layer graphene, graphitic carbon, or graphite.

7. The semiconductor device of claim 1, further comprising:
a second pattern layer having an opening on the first pattern layer; and
a third pattern layer covering the second pattern layer on the first pattern layer,
wherein the third pattern layer is in contact with the first pattern layer through the opening of the second pattern layer,
the gate layers are on the third pattern layer, and
each of the first, second, and third pattern layers includes a polysilicon layer.

8. The semiconductor device of claim 7, further comprising:
a dummy pattern on the lower insulating structure,
wherein the dummy pattern includes a lower dummy pattern layer, an intermediate dummy pattern layer, and an upper dummy pattern layer sequentially stacked,
the lower dummy pattern layer and the upper dummy pattern layer include a polysilicon layer,
the intermediate dummy pattern layer includes first, second, and third layers sequentially stacked,
the first and third layers include the same material, and
the second layer includes a material different from the first and third layers.

9. The semiconductor device of claim 1, wherein
the gate layers include lower gate layers and upper gate layers on the lower gate layers,
the memory vertical structure includes a lower vertical portion penetrating the lower gate layers, an upper vertical portion penetrating the upper gate layers, and an intermediate portion between the lower vertical portion and the upper vertical portion, and
the intermediate portion of the memory vertical structure has at least one bent portion.

10. A semiconductor device comprising:
a substrate;
a lower structure including a first wiring structure, a second wiring structure, and a lower insulating structure covering the first and second wiring structures on the substrate;
a pattern layer including a plate portion and a via portion, the plate portion of the pattern layer being on the lower insulating structure and the via portion of the pattern layer extending into the lower insulating structure from a lower portion of the plate portion and overlapping the first wiring structure in a vertical direction;
a buffer conductive layer interposed between the via portion of the pattern layer and the first wiring structure and in contact with the via portion and the first wiring structure;
a memory cell array region on the pattern layer;
an extended area on the pattern layer, adjacent the memory cell array region, the memory cell array region spaced apart from the first wiring structure in a horizontal direction; and
a contact plug in contact with the second wiring structure on the second wiring structure,
the buffer conductive layer in contact with the first wiring structure including a material different from the contact plug in contact with the second wiring structure,
wherein the plate portion overlaps a portion of the extended area in the vertical direction and extends beyond the first wiring structure in the horizontal direction opposite the extended area.

11. The semiconductor device of claim 10, wherein
a lower surface of the via portion is in contact with the buffer conductive layer, and
a side surface of the via portion is in contact with the lower insulating structure.

12. The semiconductor device of claim 10, wherein
the buffer conductive layer is a graphene-like carbon material layer.

13. The semiconductor device of claim 10, wherein
the first wiring structure includes a first pad structure,
the second wiring structure includes a second pad structure,
the first pad structure includes a first gap fill layer and a first barrier layer covering a side surface and a bottom surface of the first gap fill layer,
the second pad structure includes a second gap fill layer and a second barrier layer covering a side surface and a bottom surface of the second gap fill layer,
the first and second barrier layers are the same material,
the first and second gap fill layers are same material, and
the buffer conductive layer is in contact with the first gap fill layer and spaced apart from the first barrier layer.

14. The semiconductor device of claim 13, wherein
the contact plug extends into the second pad structure, and
a lower surface of the buffer conductive layer is at a higher level than a lower surface of the contact plug.

15. The semiconductor device of claim 13, wherein
the buffer conductive layer extends into the first gap fill layer, and
the via portion of the pattern layer is spaced apart from the first gap fill layer.

16. A semiconductor device comprising:
a substrate;

a ground impurity region on the substrate;
circuit elements including a first circuit transistor on the substrate;
a ground wiring structure electrically connected to the ground impurity region on the substrate;
a first circuit wiring structure electrically connected to the first circuit transistor on the substrate;
a lower insulating structure covering the circuit elements, the ground wiring structure, and the first circuit wiring structure on the substrate;
a pattern structure including a first pattern layer, the first pattern layer includes a plate portion and a via portion, the plate portion of the first pattern layer is on the lower insulating structure, and the via portion of the first pattern layer extending into the lower insulating structure from a lower portion of the plate portion and overlapping the ground wiring structure in a vertical direction;
a buffer conductive layer interposed between the via portion of the first pattern layer and the ground wiring structure and in contact with the via portion and the ground wiring structure;
gate layers stacked in the vertical direction and spaced apart from each other on the pattern structure, the gate layers spaced apart from the ground wiring structure in a horizontal direction;
a memory vertical structure penetrating through the gate layers in the vertical direction; and
a circuit connection wiring structure electrically connecting the pattern structure and the first circuit wiring structure,
wherein the plate portion overlaps a portion of the gate layers in the vertical direction and extends beyond the ground wiring structure in the horizontal direction opposite the gate layers.

17. The semiconductor device of claim 16, wherein the circuit connection wiring structure includes:
a first source contact plug on the pattern structure;
a second source contact plug on the first circuit wiring structure; and
a source connection wiring electrically connecting the first and second source contact plugs on the first and second source contact plugs.

18. The semiconductor device of claim 17, wherein the buffer conductive layer includes a graphene-like carbon material layer,
the plate portion and the via portion include an integral polysilicon layer,
the first source contact plug is directly or indirectly connected to the first pattern layer,
the memory vertical structure includes a channel layer, a data storage structure, and a channel pad,
a lower region of the channel layer is in contact with the pattern structure,
an upper region of the channel layer is in contact with the channel pad, and
the data storage structure is between the channel layer and the gate layers.

19. The semiconductor device of claim 16, wherein the lower insulating structure includes
a first lower insulating layer;
an etch stop layer on the first lower insulating layer; and
a second lower insulating layer on the etch stop layer,
wherein the first lower insulating layer surrounds a side surface of the ground wiring structure and a side surface of the first circuit wiring structure, and
the etch stop layer covers a portion of an upper surface of the ground wiring structure and covers at least a portion of a side surface of the buffer conductive layer.

20. The semiconductor device of claim 16, further comprising
a second circuit wiring structure on the substrate;
a second contact plug electrically connected to the second circuit wiring structure on the second circuit wiring structure;
an intermediate insulating layer in an opening of the pattern structure;
mold layers overlapping the intermediate insulating layer on the intermediate insulating layer; and
separation structures penetrating through the gate layers in the vertical direction,
wherein the mold layers are adjacent to the gate layers horizontally,
the mold layers are between the separation structures, and
the second contact plug extends into the lower insulating structure through the mold layers and the intermediate insulating layer so as to be in contact with the second circuit wiring structure.

21. The semiconductor device of claim 10, wherein the via portion includes polysilicon, and wherein the buffer conductive layer includes carbon.

* * * * *